United States Patent
Lee

(10) Patent No.: US 9,859,287 B2
(45) Date of Patent: Jan. 2, 2018

(54) SEMICONDUCTOR DEVICE AND VOLTAGE TRANSFER UNIT

(71) Applicant: SK hynix Inc., Icheon-si Gyeonggi-do (KR)

(72) Inventor: Nam Jae Lee, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/285,886

(22) Filed: Oct. 5, 2016

(65) Prior Publication Data

US 2017/0330886 A1 Nov. 16, 2017

(30) Foreign Application Priority Data

May 12, 2016 (KR) .......................... 10-2016-0058338

(51) Int. Cl.
| | |
|---|---|
| *H01L 27/115* | (2017.01) |
| *H01L 27/112* | (2006.01) |
| *G11C 16/04* | (2006.01) |
| *G11C 16/08* | (2006.01) |
| *H01L 27/02* | (2006.01) |
| *H01L 29/06* | (2006.01) |

(52) U.S. Cl.
CPC ........ *H01L 27/11286* (2013.01); *G11C 16/04* (2013.01); *G11C 16/08* (2013.01); *H01L 27/0207* (2013.01); *H01L 27/115* (2013.01); *H01L 29/0692* (2013.01)

(58) Field of Classification Search
CPC . H01L 27/0207; H01L 29/06; H01L 29/0692; H01L 29/0684
See application file for complete search history.

(56) References Cited

U.S. PATENT DOCUMENTS

| 8,982,639 | B2 * | 3/2015 | Kim .................. G11C 16/0483 365/174 |
| 2007/0155085 | A1 * | 7/2007 | Song ..................... G11C 11/412 438/199 |
| 2012/0056274 | A1 * | 3/2012 | Yoshimura ...... H01L 21/823425 257/394 |
| 2012/0140586 | A1 * | 6/2012 | Kim ........................ G11C 5/02 365/230.03 |
| 2012/0236619 | A1 * | 9/2012 | Kutsukake ......... G11C 16/0483 365/72 |
| 2015/0349126 | A1 | 12/2015 | Tanzawa | | |

* cited by examiner

*Primary Examiner* — Benjamin Sandvik
(74) *Attorney, Agent, or Firm* — William Park & Associates Ltd.

(57) ABSTRACT

A semiconductor device may include a first active region including a first main region and a first protruding part. The semiconductor device may include a second active region including a second main region and a second protruding part. The semiconductor device may include a first transistor formed on the first active region. The semiconductor device may include a second transistor formed on the second active region. The semiconductor device may include a connecting structure connecting the first protruding part and the second protruding part to each other.

8 Claims, 20 Drawing Sheets

SEMICONDUCTOR DEVICE AND VOLTAGE TRANSFER UNIT

CROSS-REFERENCE TO RELATED APPLICATION

The present application claims priority under 35 U.S.C. §119(a) to Korean patent application number 10-2016-0058338 filed on May 12, 2016, the entire disclosure of which is incorporated herein by reference.

BACKGROUND

1. Technical Field

An aspect of the present disclosure may generally relate to a semiconductor device, and more particularly, to a semiconductor device regarding a voltage transfer unit.

2. Related Art

A semiconductor device may include memory cells capable of storing data. The memory cells may be operated by a high voltage applied through high voltage transistors. The high voltage transistors should be able to endure high voltages. As the semiconductor is miniaturized, a technique is required for securing characteristics of high voltage transistors in a narrow area.

SUMMARY

According to an aspect of the present disclosure, there may be provided a semiconductor device. The semiconductor device may include a first main region and a first protruding part. The semiconductor device may include a second active region including a second main region and a second protruding part. The semiconductor device may include a first transistor formed on the first active region. The semiconductor device may include a second transistor formed on the second active region. The semiconductor device may include a connecting structure connecting the first protruding part and the second protruding part to each other.

According to an aspect of the present disclosure, there may be provided a semiconductor device. The semiconductor device may include an active region including a main region, and first and second protruding parts respectively protruding to both sides of the main region.

According to an aspect of the present disclosure, there may be provided a semiconductor device. The semiconductor device may include an active region including a line region extending along a first direction, first and second protruding parts respectively protruding from both ends of the line region along a second direction intersecting the first direction, and a third protruding part extending between the first and second protruding parts from the line region.

According to an aspect of the present disclosure, there may be provided a semiconductor device. The semiconductor device may include active regions each including a main region extending in a first direction, and first and second protruding parts respectively protruding to both sides of the main region along the first direction.

DETAILED DESCRIPTION

Figure 1:
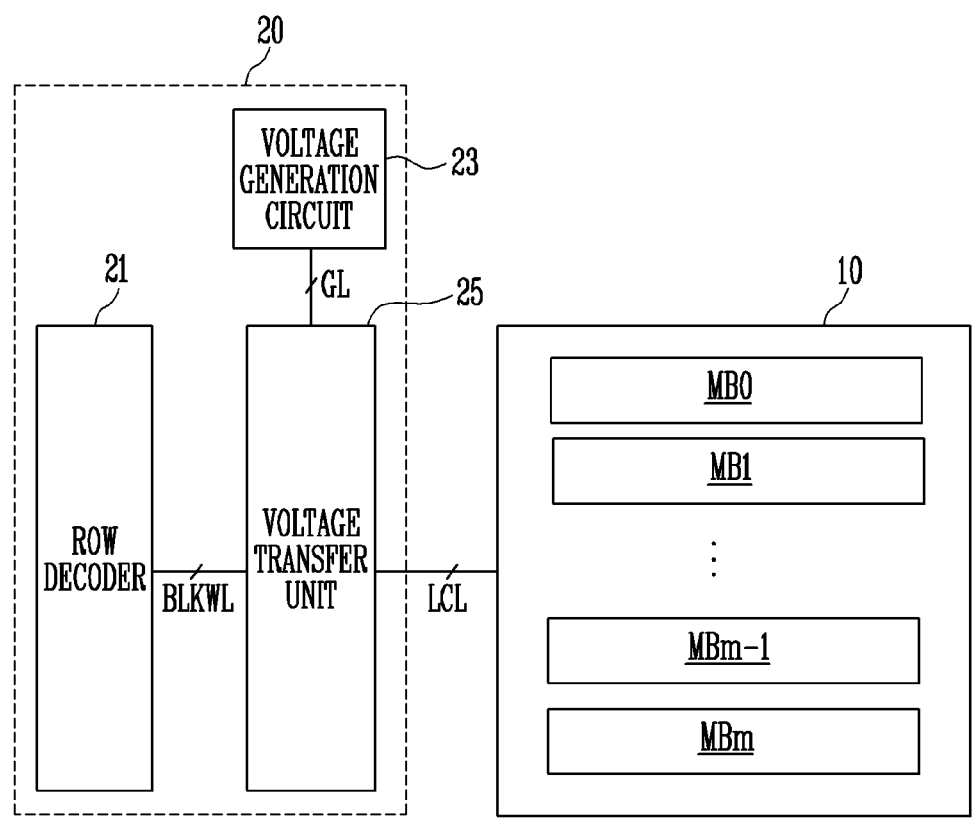
FIG. 1 is a block diagram illustrating a representation of an example of a semiconductor device according to an embodiment of the present disclosure.

Hereinafter, examples of embodiments of the present disclosure will be described in detail with reference to the accompanying drawings. However, the present disclosure is not limited to the embodiments but may be implemented into different forms. These embodiments are provided only for illustrative purposes and for full understanding of the scope of the present disclosure by those skilled in the art. Further, the scope of the present disclosure should be understood within the scope of the present disclosure defined by the appended claims.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1 is a block diagram illustrating a representation of an example of a semiconductor device according to an embodiment of the present disclosure.

Referring to FIG. 1, the semiconductor device may include a memory array 10 and a voltage supply circuit 20.

The memory array 10 includes a plurality of memory blocks MB0 to MBm. Each memory blocks MB0 to MBm includes a plurality of memory strings. Each memory strings is disposed in various forms, and includes a plurality of memory cells connected in series. For example, the memory string may be formed into a two-dimensional structure or a three-dimensional structure. Also, the memory string may be connected between a source line and a bit line. Each of the memory blocks MB0 to MBm may include memory strings connected to a plurality of bit lines. The memory strings constituting each of the memory blocks MB0 to MBm may be commonly connected to a source line. Structures of memory strings will be described later with reference to FIGS. 7A to 7D.

The voltage supply circuit 20 generates operation voltages in response to a voltage control signal of a control circuit (not illustrated), and outputs operation voltages to a selected memory block (e.g., MB0) in response to a row address signal of the control circuit. To this end, the voltage supply circuit 20 may include a row decoder 21, a voltage generation circuit 23, and a voltage transfer unit 25.

The row decoder 21 may output, to block word lines BLKWL, block select signals for selecting one memory block among the plurality of memory blocks MB0 to MBm, in response to the row address signal of the control circuit. For example, the row decoder 21 may output an activated block select signal and a non-activated block select signal in response to the row address signal.

The voltage generation circuit 23 outputs operation voltages to global lines GL in response to the voltage control signal of the control circuit. The operation voltages have levels required to perform an operation for a program loop of the memory cells, an operation for an erase loop of the memory cells, and a read operation of the memory cells. The operation voltages may include a program voltage, a read voltage, an erase voltage, a pass voltage, a select voltage, a common source voltage, and the like.

The voltage transfer unit 25 transfers the operation voltages applied to the global lines GL to local lines LCL of the selected memory block in response to the block select signals transmitted to the block word lines BLKWL. The block select signals are output from the row decoder 21 to be transmitted to the block word lines BLKWL.

Figure 2:
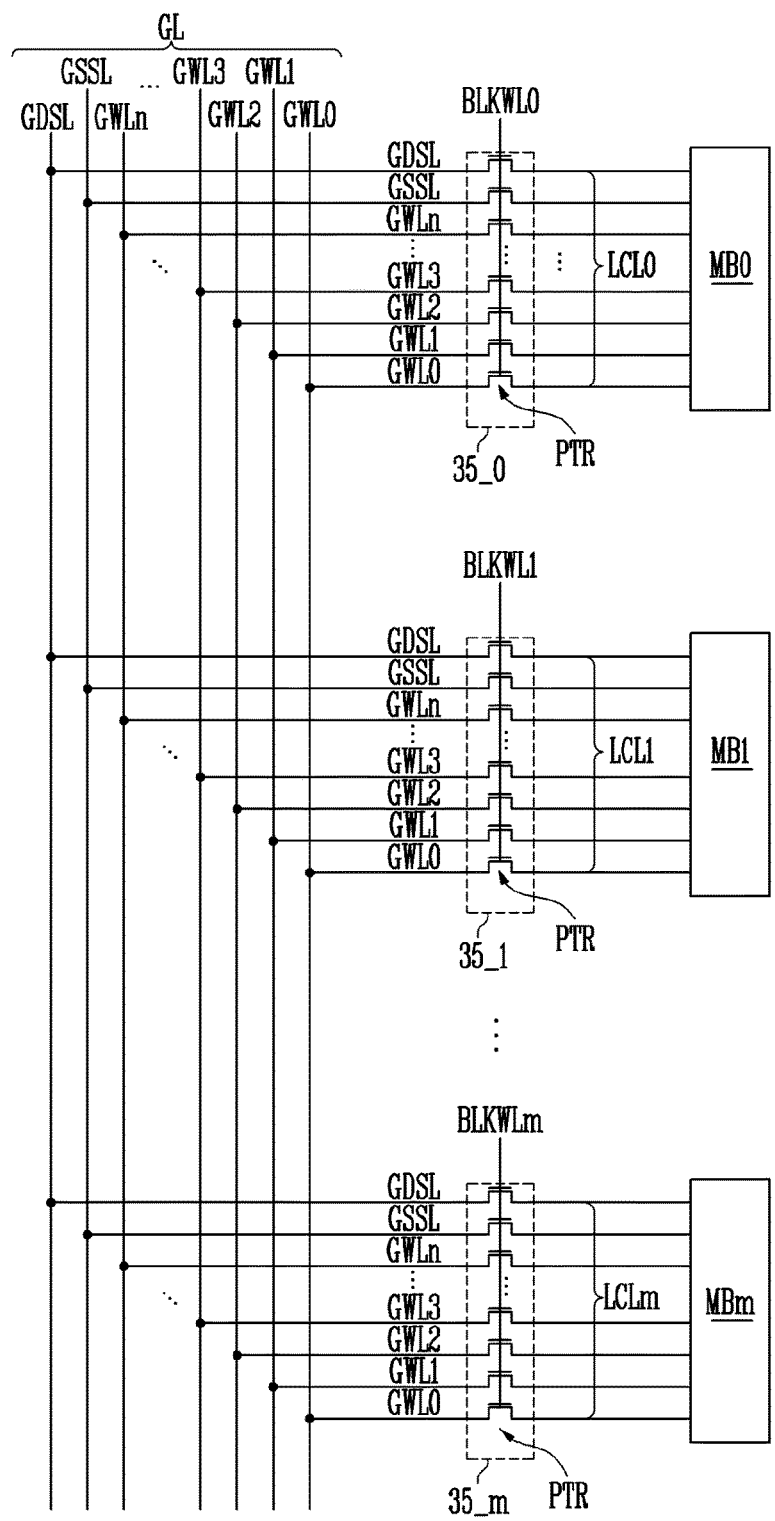
FIG. 2 is a circuit diagram illustrating a representation of an example of a voltage transfer unit according to an embodiment of the present disclosure.

FIG. 2 is a circuit diagram illustrating a representation of an example of a voltage transfer unit according to an embodiment of the present disclosure.

Referring to FIG. 2, the voltage transfer unit (25 of FIG. 1) may include voltage transfer circuits 35_0 to 35_m electrically connected to the respective memory blocks MB0 to MBm.

The voltage transfer circuits 35_0 to 35_m include pass transistors PTR connected between global lines GL and local lines LCL0 to LCLm. The pass transistors PTR may be high voltage transistors for transmitting high voltages.

The global lines GL may include a global drain select line GDSL, a global source select line GSSL, and global word lines GWL0 to GWLn. Although not illustrated in this figure, the global lines GL may further include a global pipe gate line. The voltage transfer circuits 35_0 to 35_m are commonly connected to the global lines GL to which operation voltages are applied.

The local lines LCL0 to LCLm may extend from the memory blocks MB0 to MBm. Each of the voltage transfer circuits 35_0 to 35_m is connected to local lines extending from a memory block (any one of the memory blocks MB0 to MBm) corresponding thereto. For example, an mth voltage transfer circuit 35_m is connected to local lines LCLm of an mth group, extending from an mth memory block MBm.

The pass transistors PTR of each of the voltage transfer circuits 35_0 to 35_m may be simultaneously turned on in response to an activated block select signal among block select signals transmitted to block word lines BLKWL to BLKWLnn. Each of the block word lines BLKWL to BLKWLnn is commonly connected to the pass transistors PTR connected to a memory block (any one of the memory blocks MB0 to MBm) corresponding thereto. For example, an mth block word line BLKWLnn is commonly connected to gates of the pass transistors PTR connected to the mth memory block MBm.

Hereinafter, structures of the voltage transfer unit according to various embodiments will be described, which can decrease an area occupied by the voltage transfer unit including the above-described pass transistors PTR and, simultaneously, can secure a breakdown voltage (BV) of the pass transistors PTR.

Figure 3A:
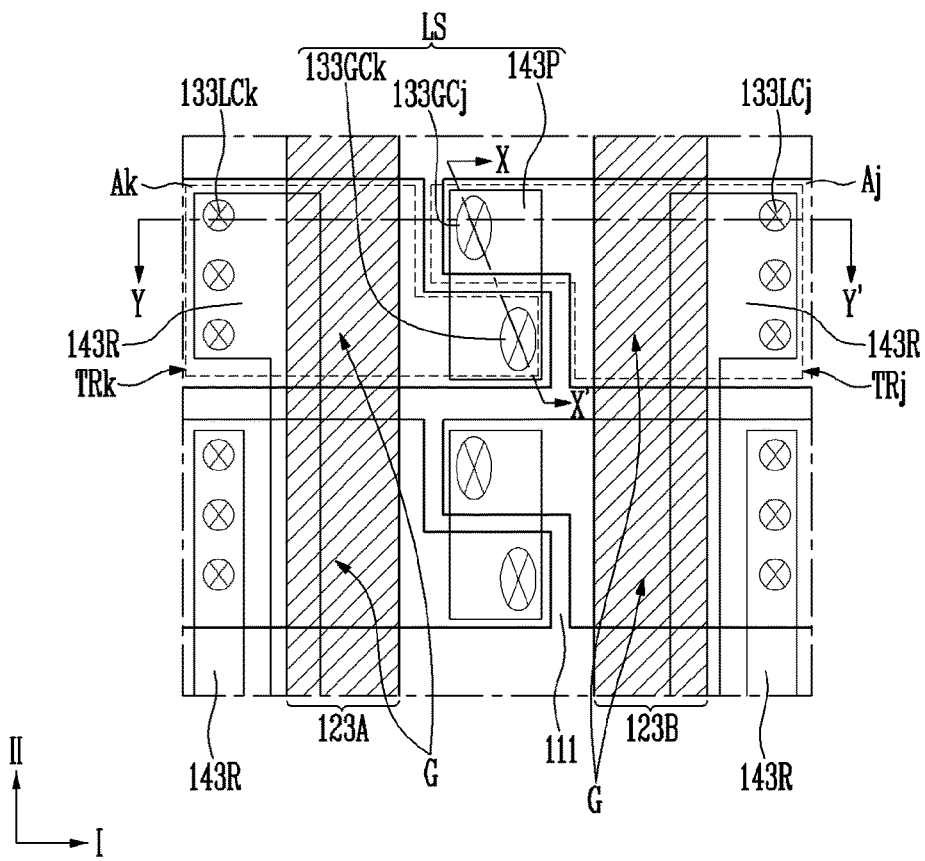
FIGS. 3A to 3C are views illustrating a representation of an example of a structure of a voltage transfer unit according to an embodiment of the present disclosure.
Figure 3B:
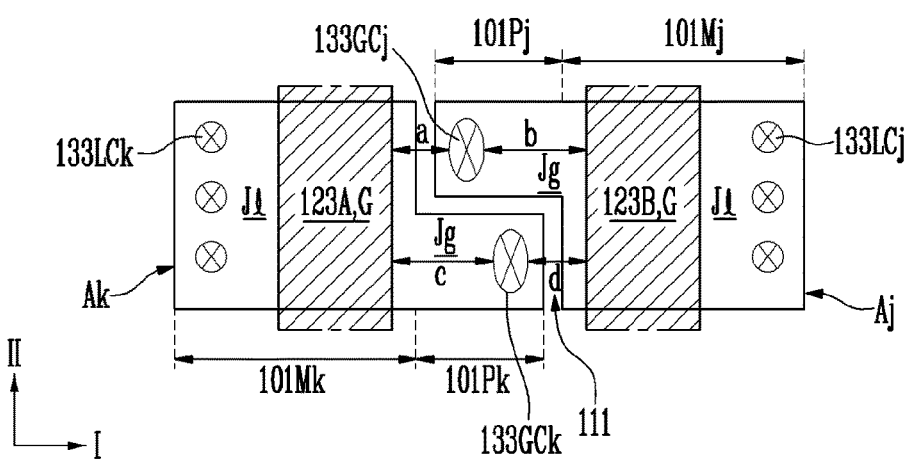
Figure 3C:
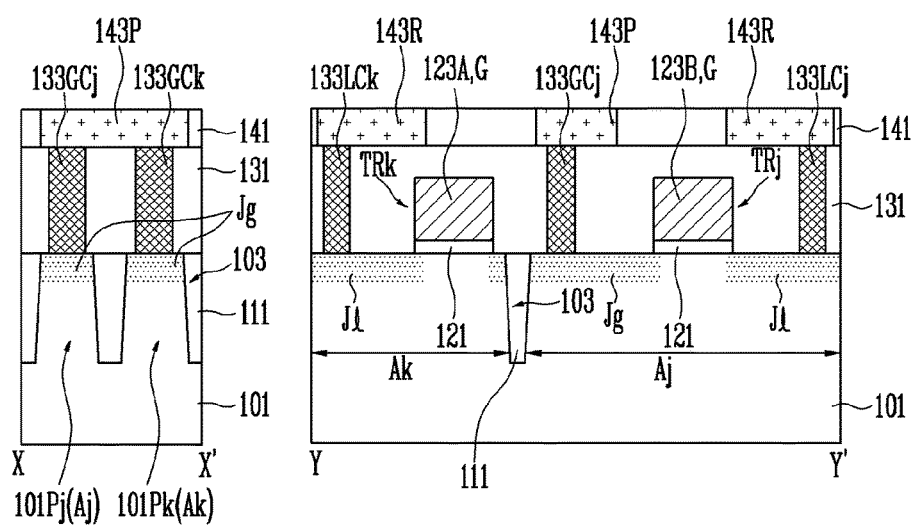

FIGS. 3A to 3C are views illustrating a representation of an example of a structure of a voltage transfer unit according to an embodiment of the present disclosure. For example, FIG. 3A is a plan view illustrating a layout of the voltage transfer unit. FIG. 3B is a plan view illustrating structures of first and second active regions. FIG. 3C illustrates sectional views respectively taken along lines X-X' and Y-Y' illustrated in FIG. 3A.

Referring to FIG. 3A, pass transistors constituting the voltage transfer unit may include a first transistor TRk and a second transistor TRj, which are disposed adjacent to each other in a first direction I. The first transistor TRk may be formed on a first active region Ak, and the second transistor TRj may be formed on a second active region Aj.

The first active region Ak and the second active region Aj may be disposed adjacent to each other in the first direction I. The first active region Ak and the second active region Aj may be structurally isolated from each other by an isolation layer 111. The first active region Ak and the second active region Aj may be electrically connected to each other through a connecting structure LS.

The connecting structure LS may include a first global contact plug 133GCk contacting the first active region Ak, a second global contact plug 133GCj contacting the second active region Aj, and a global pad 143P connected to the first global contact plug 133CGk and the second global contact plug 133GCj. The global pad 143P may be connected to any one of the global lines GL described in FIG. 2. The global pad 143P receives an operation voltage output from the voltage generation circuit (23 of FIG. 1), supplied from a global line connected thereto, to transmit the operation voltage to the first transistor TRk and the second transistor TRj.

A gate G of the first transistor TRk may be connected to a first block word line 123A disposed on the first active region Ak, and a gate G of the second transistor TRj may be connected to a second block word line 123B disposed on the second active region Aj. Each of the first and second block word lines 123A and 123B may extend along a second direction II intersecting the first direction I. The first block word line 123A and the second block word line 123B may transmit different block signals from each other. For example, an activated block select signal may be transmitted to the first block word line 123A, and a non-activated block select signal may be transmitted to the second block word line 123B.

A plurality of first transistors TRk and a plurality of first active regions Ak may be arranged in a line along the extending direction of the first block word line 123A. The first transistors TRk may be commonly connected to the first block word line 123A. The first transistors TRk may be connected to local lines extending from any one of the memory blocks MB1 to MBm illustrated in FIG. 1 or 2.

A plurality of second transistors TRj and a plurality of second active regions Aj may be arranged in a line along the extending direction of the second block word line 123B. The second transistors TRj may be commonly connected to the second block word line 123B. The second transistors TRj may be connected to local lines extending from any one of the memory blocks MB1 to MBm illustrated in FIG. 1 or 2.

The first transistors TRk and the second transistors TRj may be connected to local lines extending from different memory blocks from each other. For example, the first transistors TRk may be connected to local lines LCLm−1 of an (m−1)th group illustrated in FIG. 2, and the second transistors TRj may be connected to the local lines LCLm of the mth group illustrated in FIG. 2.

Each of the first transistors TRk may be electrically connected to a local line corresponding thereto via at least one first local contact plug 133LCk and at least one routing line 143R. Each of the second transistors TRj may be electrically connected to a local line corresponding thereto via at least one second local contact plug 133LCj and at least one routing line 143R.

The first local contact plug 133LCk and the second local contact plug 133LCj may respectively contact a portion of the first active region Ak and a portion of the second active region Aj. The portion of the first active region Ak and the portion of the second active region Aj are opposite to each other with the first block word line 123A and the second word block line 123B interposed therebetween. The connecting structure LS may be connected to a portion of the first active region Ak and a portion of the second active region Aj, which are exposed between the first block word line 123A and the second block word line 123B. Each of the first and second global contact plugs 133GCk and 133GCj of the connecting structure LS may be spaced apart from the first and second block word lines 123A and 123B at different distances from each other.

According to the above-described structure of the voltage transfer unit, a pair of the first active region Ak and the second active region Aj may be connected to the same global line through the connecting structure LS. Accordingly, in an embodiment of the present disclosure, it may be possible to decrease an area occupied by the global lines. Also, according to an above-described structure of the voltage transfer unit, the isolation layer 111 by which the first active region Ak and the second active region Aj are structurally isolated may be disposed in a substrate between the first active region Ak and the second global contact plug 133GCj and between the second active region Aj and the first global contact plug 133GCk. Accordingly, an insulation distance between the first block word line 123A on the first active region Ak and the second global contact plug 133GCj and an insulation distance between the second block word line 123B on the second active region Aj and the first global contact plug 133GCk can be secured within a narrow area. If the insulation distances are secured, a breakdown voltage (BV) can be increased, and thus it may be possible to improve the operational reliability of high voltage pass transistors including the first and second transistors TRk and TRj.

The first active region Ak and the second active region Aj, which are isolated from each other by the isolation layer 111, may be formed into structures in which a distance between the first block word line 123A and the first global contact plug 133GCk and a distance between the second block word line 123B and the second global contact plug 133GCj can be increased within a narrow area. Hereinafter, the structures of the first active region Ak and the second active region Aj will be described below with reference to FIG. 3B.

Referring to FIG. 3B, the first active region Ak may include a first main region 101MK and a first protruding part 101Pk protruding along the first direction I from a portion of the first main region 101Mk. The second active region Aj may include a second main region 101Mj and a second protruding part 101Pj protruding in the first direction I from a portion of the second main region 101Mj.

The first protruding part 101Pk faces the second active region Aj. The second protruding part 101Pj faces the first active region Ak. The first main region 101Mk and the second main region 101Mj are opposite to each other with the first protruding part 101Pk and the second protruding part 101Pj, interposed therebetween. The second protruding part 101Pj is parallel to or substantially parallel to the first protruding part 101Pk. The first protruding part 101Pk faces a sidewall of the second main region 101Mj, at which the second protruding part 101Pj is not disposed. The second protruding part 101Pj faces a sidewall of the first main region 101Mk, at which the first protruding part 101Pk is not disposed. Each of the first protruding part 101Pk and the second protruding part 101Pj has an end portion adjacent to the isolation layer 111.

The first protruding part 101Pk and the second protruding part 101Pj are connected to the first global contact plug 133GCk and the second global contact plug 133GCj of the connecting structure, respectively. According to such a structure, the first protruding part 101Pk and the second protruding part 101Pj may be electrically connected to each other through the connecting structure LS described in FIG. 3A.

The first global contact plug 133GCk and the second global contact plug 133GCj are respectively disposed on the end portion of the first protruding part 101Pk and the end portion of the second protruding part 101Pj to secure a breakdown voltage. For example, the first global contact plug 133GCk is disposed on the end portion of the first protruding part 101Pk, to be disposed closer to the second block word line 123B than the first block word line 123A. If a spacing distance between the first global contact plug 133GCk and the first block word line 123A is defined as c, and a spacing distance between the first global contact plug 133CGk and the second block word line 123B is defined as d, c>d. The second global contact plug 133GCj is disposed on the end portion of the second protruding part 101Pj, to be disposed closer to the first block word line 123A than the second block word line 123B. If a spacing distance between the second global contact plug 133GCj and the first block word line 123A is defined as a, and a spacing distance between the second global contact plug 133CGj and the second block word line 123B is defined as b, b>a.

According to the above-described structure, the spacing distance c between the first block word line 123A and the first global contact plug 133GCk may be formed along through the first protruding part 101Pk. Also, the spacing distance b between the second block word line 123B and the second global contact plug 133GCj may be formed along through the second protruding part 101Pj. That is, the spacing distance c between the first block word line 123A and the first global contact plug 133GCk and the spacing distance b between the second block word line 123B and the second global contact plug 133GCj can be increased as long as the breakdown voltage can be secured.

Global junction regions Jg into which an n-type or p-type dopant is implanted may be disposed inside the first active region Ak and the second active region Aj, which are exposed between the first block word line 123A and the second block word line 123B. The global junction regions Jg contact the first global contact plug 133GCk and the second global contact plug 133GCj of the connecting structure, to receive an operation voltage supplied from the global line.

Local junction regions 31 into which an n-type or p-type dopant is implanted may be disposed inside a portion of the first main region 101Mk of the first active region Ak and a portion of the second main region 101Mj of the second active region Aj. The local junction regions 31 of the first and second transistors may contact the first local contact plug 133LCk and the second local contact plug 133LCj connected to local lines extending from different memory blocks, respectively.

Each of the first and second global contact plugs 133GCk and 133GCj and the first and second local contact plugs 133LCk and 133LCj may be formed into various structures including a cylindrical post, a polygonal post, an elliptical post, a quadrangular post, and the like. For example, each of the first and second global contact plugs 133GCk and 133GCj may be formed as an elliptical post to increase its contact area.

Hereinafter, a sectional structure of the voltage transfer unit will be described below with reference to FIG. 3C.

Referring to FIG. 3C, the first active region Ak and the second active region Aj may be structurally isolated by a trench 103 formed inside a substrate 101 and the isolation layer 111 filling in the trench 103.

The first block word line 123A and the second block word line 123B may be disposed on the first active region Ak and the second active region Aj, respectively. A gate insulating layers 121 may be interposed between the first block word line 123A and the first active region Ak, and may be interposed between the second block word line 123B and the second active region Aj. The global junction regions Jg are formed inside the first active region Ak and the second active region Aj, which are exposed between the first block word line 123A and the second block word line 123B. The first protruding part 101Pk of the first active region Ak and the second protruding part 101Pj of the second active region Aj are exposed between the first block word line 123A and the second block word line 123B, and therefore, the global junction regions Jg may also be formed inside the first protruding part 101Pk and the second protruding part 101Pj.

The local junction regions 31 are formed inside the end portions of the first active region Ak and the second active region Aj, which are opposite to each other with the first block word line 123A and the second block word line 123B, interposed therebetween.

The first block word line 123A and the second block word line 123B may be covered with a first insulating layer 131. The first insulating layer 131 may be formed on the substrate 101 to cover the first block word line 123A and the second block word line 123B. The first insulating layer 131 may be penetrated by the first and second global contact plugs 133GCk and 133GCj and the first and second local contact plugs 133LCk and 133LCj.

The first and second global contact plugs 133GCk and 133GCj may contact top surfaces of the first and second protruding parts 101Pk and 101Pj, respectively. Accordingly, the first and second global contact plugs 133GCk and 133GCj are connected to the global junction regions 3g.

The first and second global contact plugs 133GCk and 133GCj contact top surfaces of the first and second active regions Ak and Aj, respectively, and are connected to the local junction regions 31.

The first and second global contact plugs 133GCk and 133GCj and the first and second local contact plugs 133LCk and 133LCj may be covered with a second insulating layer 141. The second insulating layer 141 may be formed on the first insulating layer 131 to cover the first and second global contact plugs 133GCk and 133GCj and the first and second local contact plugs 133LCk and 133LCj. The global pad 143P and the routing lines 143R may be formed inside the second insulating layer 141. The global pad 143P may be connected to any one of the global lines GL illustrated in FIG. 2. The routing lines 143R may be connected to the first and second local contact plugs 133LCk and 133LCj, respectively. The routing lines 143R may be respectively connected to local lines extending from different memory blocks among the memory blocks MB1 to MBm illustrated in FIG. 2.

Figure 4A:
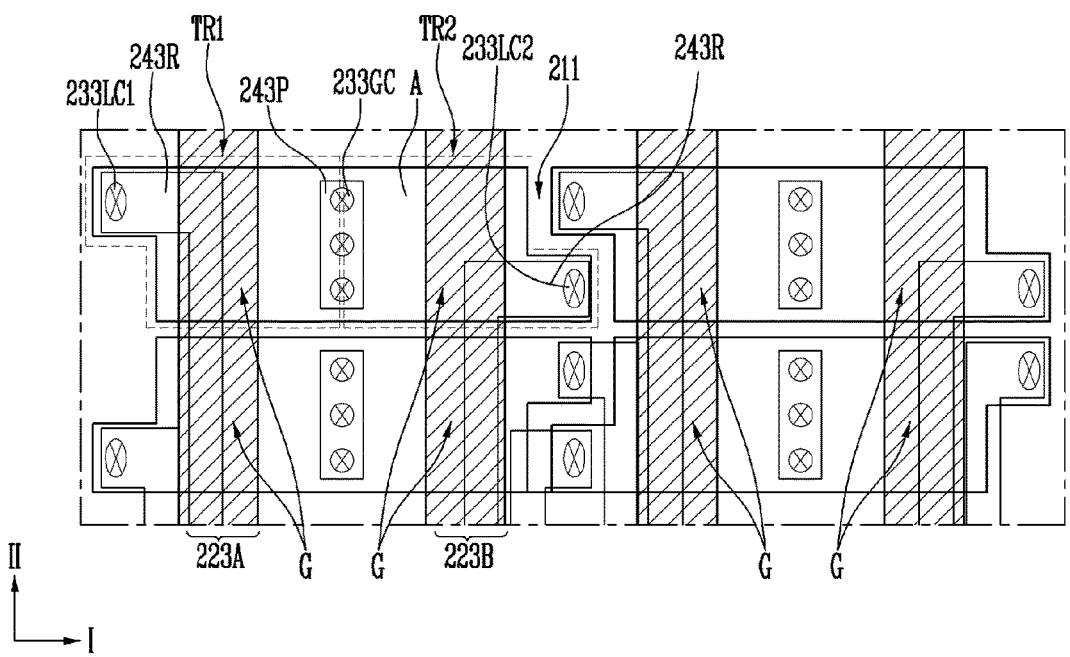
FIGS. 4A and 4B are views illustrating a representation of an example of a structure of a voltage transfer unit according to an embodiment of the present disclosure.
Figure 4B:
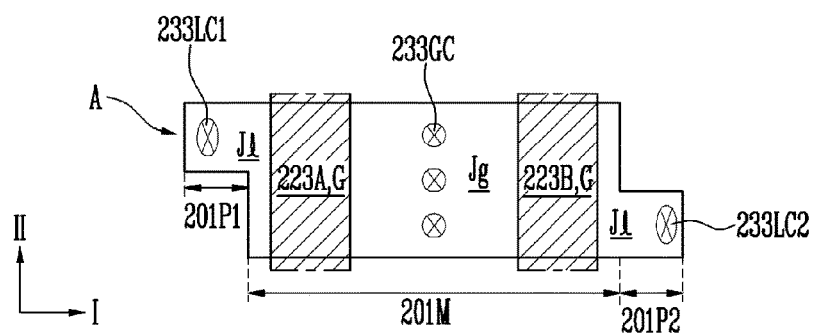

FIGS. 4A and 4B are views illustrating a representation of an example of a structure of a voltage transfer unit according to an embodiment of the present disclosure. For example, FIG. 4A is a plan view illustrating a layout of the voltage transfer unit. FIG. 4B is a plan view illustrating a structure of an active region.

Referring to FIG. 4A, pass transistors constituting the voltage transfer unit may include a first transistor TR1 and a second transistor TR2, which share an active region A with each other. The first transistor TR1 and the second transistor TR2 may be disposed adjacent to each other in a first direction I, and may be disposed on the active region A.

A gate G of the first transistor TR1 may be connected to a first block word line 223A disposed on the active region A, and a gate G of the second transistor TR2 may be connected to a second block word line 223B disposed on the active region A. Each of the first and second block word lines 223A and 223B may extend along a second direction II intersecting the first direction I. The first block word line 223A and the second block word line 223B may transmit different block select signals from each other. For example, an activated block select signal may be transmitted to the first block word line 223A, and a non-activated block select signal may be transmitted to the second block word line 223B.

The active region A may receive an operation voltage applied through a global pad 243P and a global contact plug 233GC. The global pad 243P may be connected to any one of the global lines GL described in FIG. 2. The global pad 243P receives an operation voltage output from the voltage generation circuit (23 of FIG. 1), supplied from the global line connected thereto, to transmit the operation voltage to the global contact plug 233GC connected to a lower portion of the global pad 243P. The operation voltage may be supplied, via the global contact plug 233GC, to the active region A connected to a lower portion of the global contact plug 233GC. The global pad 234P and the global contact plug 233GC may be electrically connected to the active region A between the first block word line 223A and the second block word line 223B.

The first transistor TR1 may be connected to a local line extending from any one of the memory blocks MB1 to MBm illustrated in FIG. 1 or 2. The second transistor TR2 may be connected to a local line extending from any one of the memory blocks MB1 to MBm illustrated in FIG. 1 or 2. The first transistor TR1 and the second transistor TR2 may be connected to local lines extending from different memory blocks from each other. For example, the first transistor TR1 may be connected to any one of the local lines LCLm−1 of the (m−1)th group illustrated in FIG. 2, and the second transistor may be connected to any one of the local lines LCLm of the mth group illustrated in FIG. 2.

The first transistor TR1 may be electrically connected to a local line corresponding thereto via at least one first local contact plug 233LC1 and at least one routing line 243R. The second transistor TR2 may be electrically connected to a local line corresponding thereto via at least one second local contact plug 233LC2 and at least one routing line 243R.

The first local contact plug 233LC1 and the second local contact plug 233LC2 may respectively contact both ends of the active region A, which are opposite to each other with the first block word line 223A and the second block word line 223B, interposed therebetween.

According to the above-described structure of the voltage transfer unit, the operation voltage may be supplied, through one global line, to the first and second transistors TR1 and TR2 sharing the active region A with each other. Accordingly, it is possible to decrease the area occupied by the global lines.

A plurality of active regions A may be configured in a matrix form along the first direction I and the second direction II intersecting the first direction I. The plurality of active regions may be structurally isolated by an isolation layer 211.

Each of the active regions A isolated by the isolation layer 211 may be formed into a structure in which a distance between the first block word line 223A and the first local contact plug 233LC1 and a distance between the second block word line 223B and the second local contact plug 233LC2 can be increased within a narrow area. Hereinafter, the structure of the active region A will be described below with reference to FIG. 4B.

Referring to FIG. 4B, the active region A may include a main region 201M, and a first protruding part 201P1 and a second protruding part 201P2, which respectively protrude to both sides of the main region 201M along the first direction I. The first protruding part 201P1 and the second protruding part 201P2 respectively protrude from corners of the main region 201M, which are opposite to each other in a diagonal direction. The first protruding part 201P1 and the second protruding part 201P2 are connected to the first local contact plug 233LC1 and the second local contact plug 233LC2, respectively. According to such a structure, the distance between the first block word line 223A and the first local contact plug 233LC1 and the distance between the second block word line 223B and the second local contact plug 233LC2 may be increased in proportion to extending lengths of the first protruding part 201P1 and the second protruding part 201P2. As a result, a breakdown voltage of high voltage pass transistors including the first and second transistors TR1 and TR2 illustrated in FIG. 4A can be increased, and thus it may be possible to improve the operational reliability of the high voltage pass transistors.

The active region may include a global junction region Jg. The global junction region Jg is a region formed by implanting an n-type or p-type dopant is implanted into the main region 201M of the active region A, exposed between the first block word line 223A and the second block word line 223B. The first and second transistors TR1 and TR2 illustrated in FIG. 4A share the global junction region Jg with each other. The global junction region Jg contacts the global contact plug 233GC, to receive an operation voltage supplied from a global line.

The active region A may include local junction regions 31. The local junction regions 31 may be formed by implanting an n-type or p-type dopant into the first protruding part 201P1 and the second protruding part 201P2. The local junction regions 31 may respectively contact the first local contact plug 233LC1 and the second local contact plug 233LC2, connected to local lines extending from different memory blocks from each other.

Figure 5A:
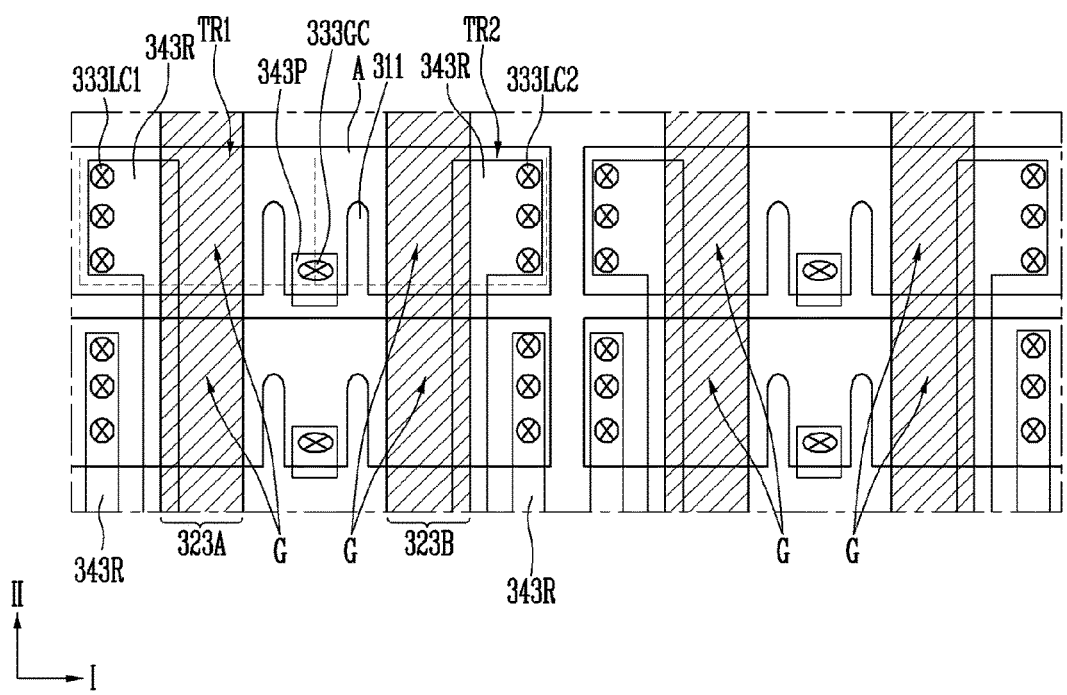
FIGS. 5A and 5B are views illustrating a representation of an example of a structure of a voltage transfer unit according to an embodiment of the present disclosure.
Figure 5B:
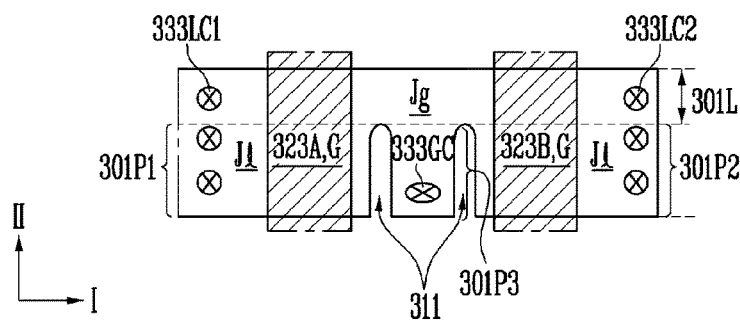

FIGS. 5A and 5B are views illustrating a representation of an example of a structure of a voltage transfer unit according to an embodiment of the present disclosure. For example, FIG. 5A is a plan view illustrating a layout of the voltage transfer unit. FIG. 5B is a plan view illustrating a structure of an active region.

Referring to FIG. 5A, pass transistors constituting the voltage transfer unit may include a first transistor TR1 and a second transistor TR2, which share an active region A with each other. The first transistor TR1 and the second transistor TR2 may be disposed adjacent to each other in a first direction I, and may be disposed on the active region A.

A gate G of the first transistor TR1 may be connected to a first block word line 323A disposed on the active region A, and a gate G of the second transistor TR2 may be connected to a second block word line 323B. Each of the first and second block word lines 323A and 323B may extend along a second direction II intersecting the first direction I. The first block word line 323A and the second block word line 323B may transmit different block select signals from each other. For example, an activated block select signal may be transmitted to the first block word line 323A, and a non-activated block select signal may be transmitted to the second block word line 323B.

The active region A may receive an operation voltage applied through a global pad 343P and a global contact plug 333GC. The global pad 343P may be connected to any one of the global lines GL described in FIG. 2. The global pad 343P receives an operation voltage output from the voltage generation circuit (23 of FIG. 1), supplied from a global line connected thereto, to transmit the operation voltage to the global contact plug 333GC connected to a lower portion of the global pad 343P. The operation voltage may be supplied, via the global contact plug 333GC, to the active region A connected to a lower portion of the global contact plug 333GC. The global pad 343P and the global contact plug 333GC may be electrically connected to the active region A between the first block word line 323A and the second block word line 323B.

The first transistor TR1 may be connected to a local line extending from any one of the memory blocks MB1 to MBm illustrated in FIG. 1 or 2. The second transistor TR2 may be connected to a local line extending from any one of the memory blocks MB1 to MBm illustrated in FIG. 1 or 2. The first transistor TR1 and the second transistor TR2 may be connected to local lines extending from different memory blocks from each other. For example, the first transistor TR1 may be connected to any one of the local lines LCLm−1 of the (m−1)th group illustrated in FIG. 2, and the second transistor may be connected to any one of the local lines LCLm of the mth group illustrated in FIG. 2.

The first transistor TR1 may be electrically connected to a local line corresponding thereto via at least one first local contact plug 333LC1 and at least one routing line 343R. The second transistor TR2 may be electrically connected to a local line corresponding thereto via at least one second local contact plug 333LC2 and at least one routing line 343R.

The first local contact plug 333LC1 and the second local contact plug 333LC2 may respectively contact both ends of the active region A, which are opposite to each other with the first block word line 323A and the second block word line 323B, interposed therebetween.

According to the above-described structure of the voltage transfer unit, the operation voltage may be supplied, through one global line, to the first and second transistors TR1 and TR2 sharing the active region A with each other. Accordingly, it may be possible to decrease the area occupied by the global lines.

A plurality of active regions A may be configured in a matrix form along the first direction I and the second direction II intersecting the first direction I. The plurality of active regions may be structurally isolated by an isolation layer 311.

Each of the active regions A isolated by the isolation layer 311 may be formed into a structure in which a distance between the first block word line 323A and the global contact plug 333GC and a distance between the second block word line 323B and the global contact plug 333GC can be increased within a narrow area. Hereinafter, the structure of the active region A will be described below with reference to FIG. 5B.

Referring to FIG. 5B, the active region A may include a line region 301L extending along the first direction I and first to third protruding parts 301P1 to 301P3 extending along the second direction II intersecting the first direction from the line region 301L. The first protruding part 301P1 and the second protruding part 301P2 protrude from both ends of the line region 301L, respectively. The third protruding part 301P3 is disposed between the first protruding part 301P1 and the second protruding part 301P2.

The first block word line 323A may extend to overlap with an upper portion of the first protruding part 301P1, and the second block word line 323B may extend to overlap with an upper portion of the second protruding part 301P2.

The active region A may include local junction regions 31 of the first and second transistors and a global junction region Jg shared by the first and second transistors.

The local junction regions 31 are regions formed by implanting an n-type or p-type dopant into both sides of the active region A, which are opposite to each other with the first block word line 323A and the second block word line 323B, interposed therebetween. The local junction regions 31 may respectively contact the first local contact plug 333LC1 and the second local contact plug 333LC2, which are connected to local lines extending from different memory blocks from each other. The local junction regions 31 may be formed inside the first and second protruding parts 301P1 and 301P2, respectively. The first local contact plug 333LC1 and the second local contact plug 333LC2 may contact the first and second protruding parts 301P1 and 301P2, respectively.

The global junction region Jg is a region formed by implanting an n-type or p-type dopant into the active region A exposed between the first block word line 323A and the second block word line 323B. The first and second transistors TR1 and TR2 illustrated in FIG. 5A share the global junction region Jg with each other. The global junction region Jg contacts the global contact plug 333GC, to receive an operation voltage supplied from a global line. The third protruding part 301P3 is exposed between the first block word line 323A and the second block word line 323B, and therefore, the global junction region Jg may be disposed inside the third protruding part 301P3.

The global contact plug 333GC contacts the third protruding part 301P3, to supply an operation voltage to the global junction region Jg. The isolation layer 311 defining the active region A extends between the first protruding part 301P1 and the third protruding part 301P3 and between the second protruding part 301P2 and the third protruding part 301P3. According to such a structure, an insulation distance between the first block word line 323A and the global contact plug 333GC and an insulation distance between the second block word line 323B and the global contact plug 333GC can be secured within a narrow area. If the insulation distances are secured, a breakdown voltage can be increased, and thus it may be possible to improve the operational reliability of high voltage pass transistors including the first and second transistors.

Figure 6A:
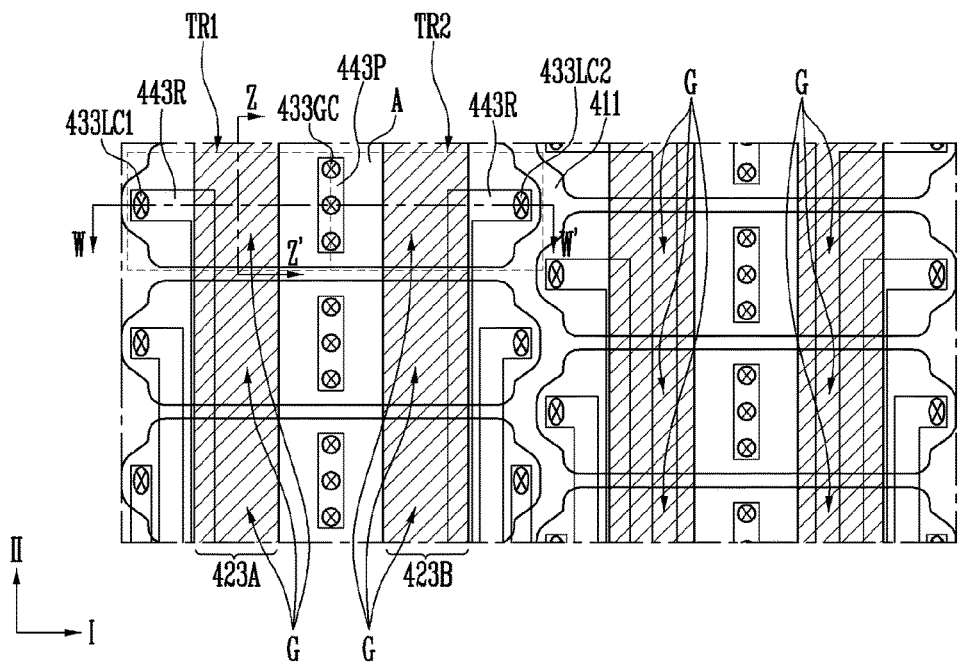
FIGS. 6A to 6C are views illustrating a representation of an example of a structure of a voltage transfer unit according to an embodiment of the present disclosure.
Figure 6B:
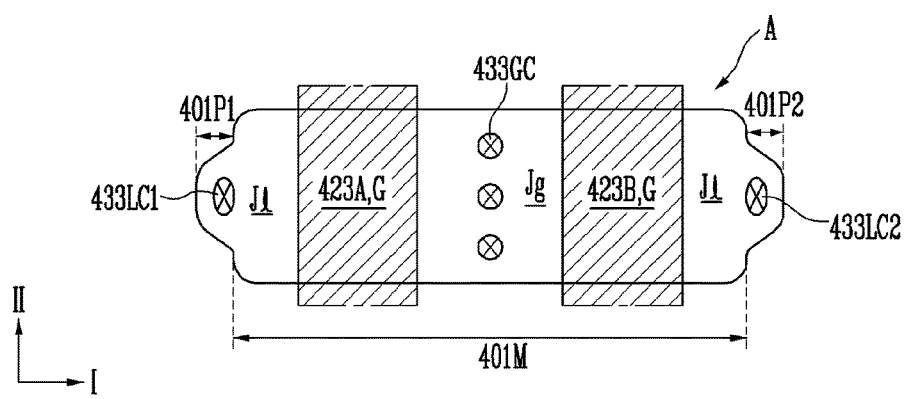
Figure 6C:
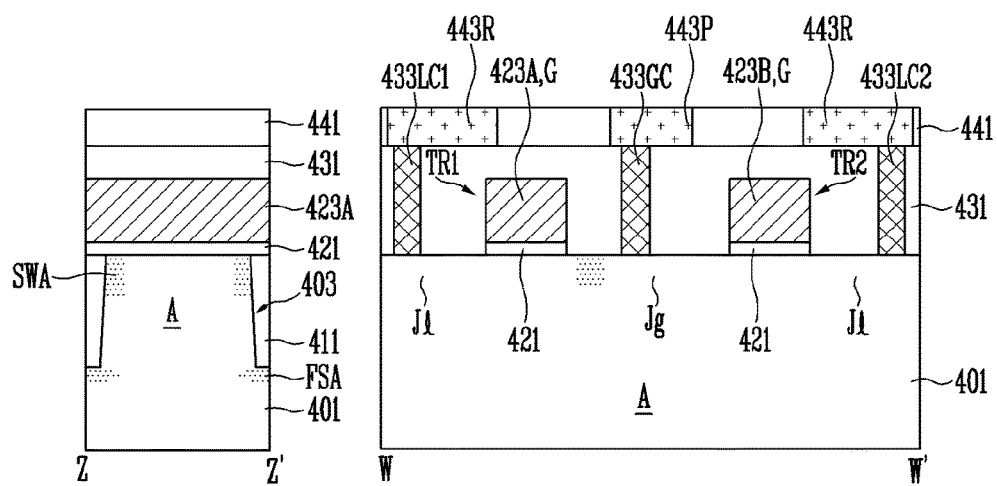

FIGS. 6A to 6C are views illustrating a representation of an example of a structure of a voltage transfer unit according to an embodiment of the present disclosure. For example, FIG. 6A is a plan view illustrating a layout of the voltage transfer unit. FIG. 6B is a plan view illustrating a structure of an active region. FIG. 6C illustrates sectional views respectively taken along lines Z-Z' and W-W' illustrated in FIG. 6A.

Referring to FIG. 6A, pass transistors constituting the voltage transfer unit may include a first transistor TR1 and a second transistor TR2, which are disposed on an active region A. The first transistor TR1 and the second transistor TR2 share the active region A with each other, and may be disposed adjacent to each other in a first direction I.

A gate G of the first transistor TR1 may be connected to a first block word line 423A disposed on the active region A, and a gate G of the transistor TR2 may be connected to a second block word line 423B disposed on the active region A. Each of the first and second block word lines 423A and 423B may extend along a second direction II intersecting the first direction I. The first block word line 423A and the second block word line 423B may transmit different block select signals from each other. For example, an activated block select signal may be transmitted to the first block word line 423A, and a non-activated block select signal may be transmitted to the second block word line 423B.

The active region A may receive an operation voltage applied through a global pad 443P and a global contact plug 433GC. The global pad 443P may be connected to any one of the global lines GL described in FIG. 2. The global pad 443P receives an operation voltage output from the voltage generation circuit (23 of FIG. 1), supplied from a global line connected thereto, to transmit the operation voltage to the global contact plug 433GC connected to a lower portion of the global pad 443P. The operation voltage may be supplied, via the global contact plug 433GC, to the active region A connected to a lower portion of the global contact plug 433GC. The global pad 443P and the global contact plug 433GC may be electrically connected to the active region A between the first block word line 423A and the second block word line 423B.

The first transistor TR1 may be connected to a local line extending from any one of the memory blocks MB1 to MBm illustrated in FIG. 1 or 2. The second transistor TR2 may be connected to a local line extending from any one of the memory blocks MB1 to MBm illustrated in FIG. 1 or 2. The first transistor TR1 and the second transistor TR2 may be connected to local lines extending from different memory blocks from each other. For example, the first transistor TR1 may be connected to any one of the local lines LCLm−1 of the (m−1)th group illustrated in FIG. 2, and the second transistor may be connected to any one of the local lines LCLm of the mth group illustrated in FIG. 2.

The first transistor TR1 may be electrically connected to a local line corresponding thereto via at least one first local contact plug 433LC1 and at least one routing line 443R. The second transistor TR2 may be electrically connected to a local line corresponding thereto via at least one second local contact plug 433LC2 and at least one routing line 443R.

The first local contact plug 433LC1 and the second local contact plug 433LC2 may respectively contact both ends of the active region A, which are opposite to each other with the first block word line 423A and the second block word line 423B, interposed therebetween.

According to the above-described structure of the voltage transfer unit, the operation voltage may be supplied, through one global line, to the first and second transistors TR1 and TR2 sharing the active region A with each other. Accordingly, it may be possible to decrease the area occupied by the global lines.

A plurality of active regions A may be structurally isolated by an isolation layer 411. The active regions A may be disposed in at least two columns. Each column of the active regions A may be disposed along the second direction II intersecting the first direction I. Each of the active regions A may be formed into a structure including protruding parts to increase a distance between the first block word line 423A and the first local contact plug 433LC1 and a distance between the second block word line 423B and the second local contact plug 433LC2. The at least two columns of active regions A including the protruding parts may be arranged in a zigzag to achieve a dense arrangement. Hereinafter, the structure of the active region A will be described below with reference to FIG. 6B.

Referring to FIG. 6B, the active region A may include a main region 401M, and a first protruding part 401P1 and a second protruding part 401P2, which respectively protrude to both sides of the main region 401M along the first direction I. A width of the main region 401M may be formed wither than those of the first protruding part 401P1 and the second protruding part 401P2. Sidewalls of the main region 401M may be exposed to both sides of the first protruding part 401P1 and both sides of the second protruding part 401P2.

The first protruding part 401P1 and the second protruding part 401P2 are connected to the first local contact plug 433LC1 and the second local contact plug 433LC2, respectively. According to such a structure, the distance between the first block word line 423A and the first local contact plug 433LC1 and the distance between the second block word line 423B and the second local contact plug 433LC2 may be increased in proportion to extending lengths of the first protruding part 401P1 and the second protruding part 401P2. As a result, a breakdown voltage of high voltage pass transistors including the first and second transistors TR1 and TR2 illustrated in FIG. 6A can be increased. Thus, in an embodiment of the present disclosure, it may be possible to improve the operational reliability of the high voltage pass transistors.

The first block word line 423A and the second block word line 423B are disposed on the main region 401M. A global junction region Jg is a region formed by implanting an n-type or p-type dopant into the main region 401M of the active region A, exposed between the first block word line 423A and the second block word line 423B. The first and second transistors TR1 and TR2 illustrated in FIG. 6A share the global junction region Jg with each other. The global junction region Jg contacts the global contact plug 433GC, to receive an operation voltage supplied from a global line.

Local junction regions 31 may be disposed, which are formed by implanting an n-type or p-type dopant into the first protruding part 401P1 and the second protruding part 401P2. The local junction regions 31 may respectively contact the first local contact plug 433LC1 and the second local contact plug 433LC2, which are connected to local lines extending from different memory blocks from each other.

Hereinafter, a sectional structure of the voltage transfer unit will be described below with reference to FIG. 6C.

Referring to FIG. 6C, the active region A may be structurally isolated by a trench 403 formed inside a substrate 401 and the isolation layer 411 filled in the trench 403.

The first block word line 423A and the second block word line 423B may be disposed on the active region A. A gate insulating layer 421 may be interposed between the first block word line 423A and the active region A, and may be interposed between the second block word line 423B and the active region A.

The global junction region Jg is formed inside the active region A exposed between the first block word line 423A and the second block word line 423B.

The local junction regions 31 may be formed inside both ends of the active region A, which are opposite to each other with the first block word line 423A and the second block word line 423B, interposed therebetween. The local junction regions 31 may be formed inside the first and second protruding parts of the active region A.

The active region A may further include a sidewall dopant implantation region SWA. The sidewall dopant implantation region SWA is a region into which a dopant for preventing the occurrence of a hump is implanted. The sidewall dopant implantation region SWA may prevent a hump and a leakage current from occurring due to a decrease in threshold voltage at edges of channels of the first and second transistors TR1 and TR2. The sidewall dopant implantation region SWA may be formed inside sidewalls of the active region A, which overlap with the first block word line 423A and the second block word line 423B.

The substrate 401 may further include a field stop area FSA. The field stop area FSA may be formed by implanting a dopant into the substrate 401 under the isolation layer 411 to prevent a leakage current from occurring in an operation of the first or second transistor TR1 or TR2 that is a high voltage transistor.

The first block word line 423A and the second block word line 423B may be covered with a first insulating layer 431. The first insulating layer 431 may be formed on the substrate 401 to cover the first block word line 423A and the second block word line 423B. The first insulating layer 431 may be penetrated by the global contact plug 433GC and the first and second local contact plugs 433LC1 and 433LC2.

The global contact plug 433GC is connected to the global junction region Jg. The first and second local contact plugs 433LC1 and 433LC2 are connected to the local junction regions 31.

The global contact plug 433GC and the first and second local contact plugs 433LC1 and 433LC2 may be covered by a second insulating layer 441. The second insulating layer 441 may be formed on the first insulating layer 431 to cover the global contact plug 433GC and the first and second local contact plugs 433LC1 and 433LC2. The global pad 443P and the routing lines 443R may be formed inside the second insulating layer 441. The global pad 443P may be connected to a top surface of the global contact plug 433GC. The global pad 443P may be connected to any one of the global lines GL illustrated in FIG. 2. The routing lines 443R may be connected to the first and second local contact plugs 433LC1 and 433LC2, respectively. The routing lines 443R may be respectively connected to local lines extending from different memory blocks among the memory blocks MB1 to MBm illustrated in FIG. 2.

FIGS. 7A to 7D are views illustrating a representation of an example of various structures of memory strings of a memory block according to an embodiment of the present disclosure. The structures of the memory strings illustrated in FIGS. 7A to 7D may be included in any one of the memory blocks MB0 to MBm described in FIGS. 1 and 2. For convenience of description, interlayer insulating layers are not illustrated in FIGS. 7A to 7D.

Figure 7A:
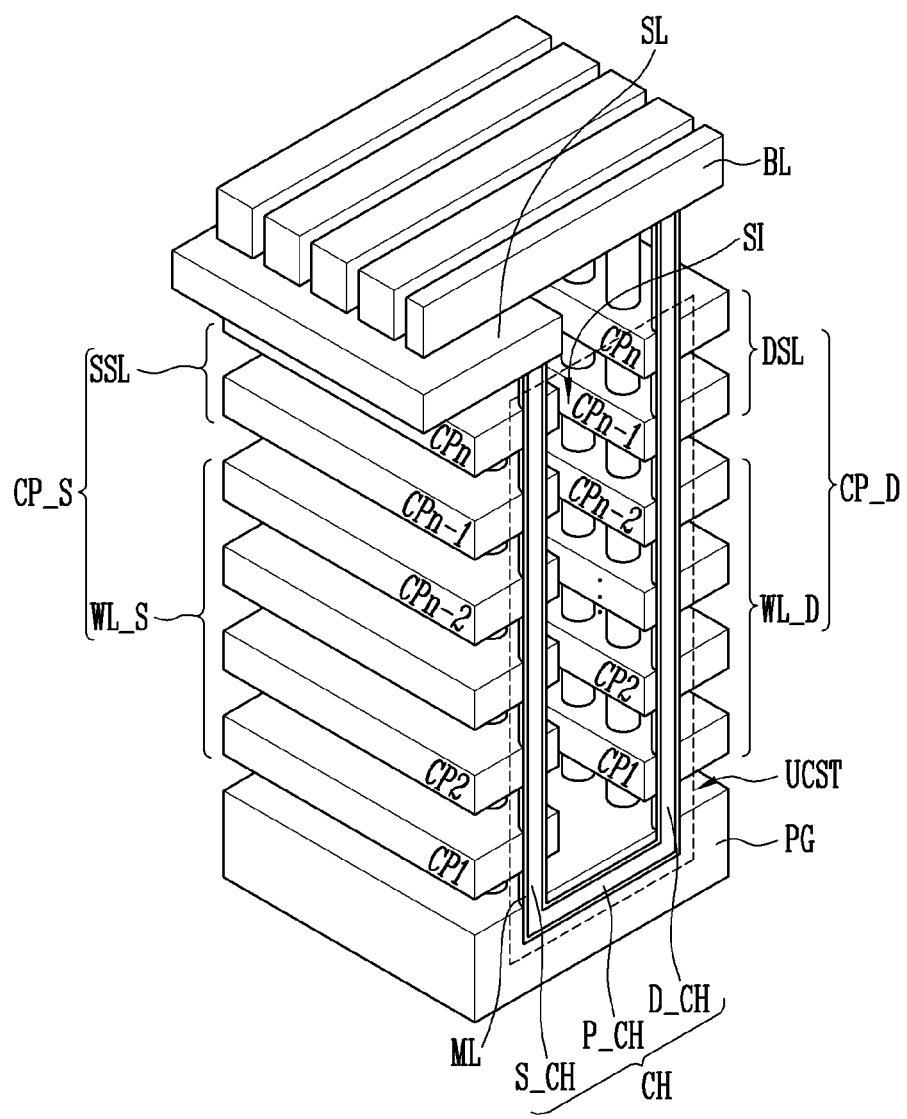
FIGS. 7A to 7D are views illustrating a representation of an example of various structures of memory strings of a memory block according to an embodiment of the present disclosure.

FIG. 7A is a perspective view illustrating a U-type memory string having a three-dimensional structure.

Referring to FIG. 7A, the U-type memory string UCST may include memory cells and select transistors, which are arranged along a U-type channel layer CH. Gates of the memory cells and gates of the select transistors may be connected to conductive patterns CP1 to CPn.

The channel layer CH may include a pipe channel layer P_CH buried in a pipe gate PG, and a source-side channel layer S_CH and a drain-side channel layer D_CH, which extend from the pipe channel layer P_CH. The channel layer CH may be formed in a tubular shape while surrounding a core insulating layer filled in a central region of a U-shaped hole, or may be formed in a buried shape to be completely filled in the central region of the U-shaped hole.

The channel layer CH may be electrically connected between a source line SL and a bit line BL. The bit line BL and the source line SL are disposed in different layers from each other, and are spaced apart from each other. For example, the source line SL may be disposed under the bit line BL. The source line SL may be electrically connected to a top end of the source-side channel layer S_CH. A source contact plug may be formed between the source line SL and the source-side channel layer S_CH. The bit line BL may be electrically connected to a top end of the drain-side channel layer D_CH. The bit line BL may extend along a direction intersecting the source line SL. A drain contact plug may be formed between the bit line BL and the drain-side channel layer D_CH.

The conductive patterns CP1 to CPn may be disposed in n layers spaced apart from each other under the bit line BL and the source line SL. The conductive patterns CP1 to CPn may include source-side conductive patterns CP_S and drain-side conductive patterns CP_D.

The source-side conductive patterns CP_S surround the source-side channel layer S_CH, and may be stacked on each other while being spaced apart each other. The source-side conductive patterns CP_S may include a source-side word lines WL_S and a source select line SSL. The source select line SSL may be disposed over the source-side word lines WL_S. The source select line SSL may be disposed in one layer or two or more layers over the source-side word lines WL_S. A case where the source select line SSL is configured with an nth pattern CPn disposed in the uppermost layer of the source-side conductive patterns CP_S and an (n−1)th pattern CPn−1 thereunder is illustrated in this figure, but the present disclosure is not limited thereto.

The drain-side conductive patterns CP_D surround the drain-side channel layer D_CH, and may be stacked on each other while being spaced apart from each other. The drain-side conductive patterns CP_D may include drain-side word lines WL_D and a drain select line DSL. The drain select line DSL may be disposed over the drain-side word lines WL_D. The drain select line DSL may be disposed in one layer or two or more layers over the drain-side word lines WL_D. A case where the drain select line DSL is configured with an nth pattern CPn disposed in the uppermost layer of the drain-side conductive patterns CP_D and an (n−1)th pattern CPn−1 thereunder is illustrated in this figure, but the present disclosure is not limited thereto.

The source-side conductive patterns CP_S and the drain-side conductive patterns CP_D may be separated from each other with a slit SI interposed therebetween.

The pipe gate PG is disposed under the source-side conductive patterns CP_S and the drain-side conductive patterns CP_D, and may be formed to surround the pipe channel layer P_CH. The pipe gate PG may be disposed under the conductive patterns CP1 to CPn.

An outer wall of the channel layer CH may be surrounded by a multi-layered layer ML. The multi-layered layer ML may include a tunnel insulating layer, a data storage layer, and a blocking insulating layer. The tunnel insulating layer may be formed along the outer wall of the channel layer CH, the data storage layer may be formed along an outer wall of the tunnel insulating layer, and the blocking insulating layer may be formed along an outer wall of the data storage layer.

Source-side memory cells are formed at intersection portions of the source-side channel layer S_CH and the source-side word lines WL_S, and drain-side memory cells are formed at intersection portions of the drain-side channel layer D_CH and the drain-side word lines WL_D. A source select transistor is formed at an intersection portion of the source-side channel layer S_CH and the source select line SSL, and a drain select transistor is formed at an intersection portion of the drain-side channel layer D_CH and the drain select line DSL. A pipe transistor is formed at an intersection portion of the pipe channel layer P_CH and the pipe gate PG. A source select transistor, source-side memory cells, a pipe transistor, drain-side memory cells, and a drain select transistor, which are arranged along one channel layer CH may be connected in series through the channel layer CH. The source select transistor, the source-side memory cells, the pipe transistor, the drain-side memory cells and the drain select transistor, which are connected in series, define a U-type memory string UCST along the U-type shape of the channel layer CH. The source-side word lines WL_S, the drain-side word lines WL_D, the source select line SSL, the drain select line DSL, and the pipe gate PG correspond to the local lines described in FIG. 1. For example, the source-side word lines WL_S, the drain-side word lines WL_D, the source select line SSL, the drain select line DSL, and the pipe gate PG correspond to any one group among the local line groups LCL0 to LCLm illustrated in FIG. 2.

The channel layer CH may be formed in various shapes such as a W-type shape, in addition to the U-type shape. The arrangement of the memory cells may be variously changed depending on structures of the channel layer CH, and accordingly, the structure of a memory string may be formed in various shapes.

Figure 7B:
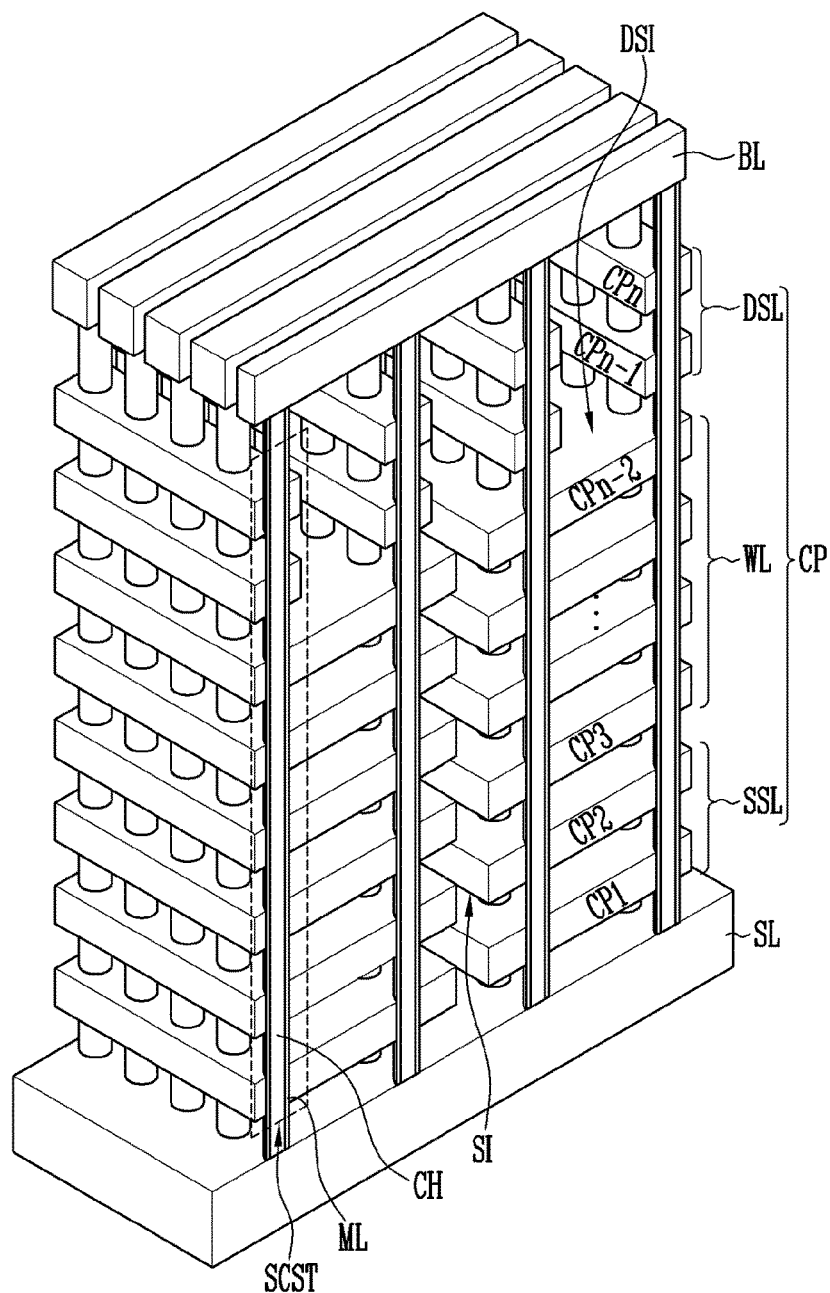
Figure 7C:
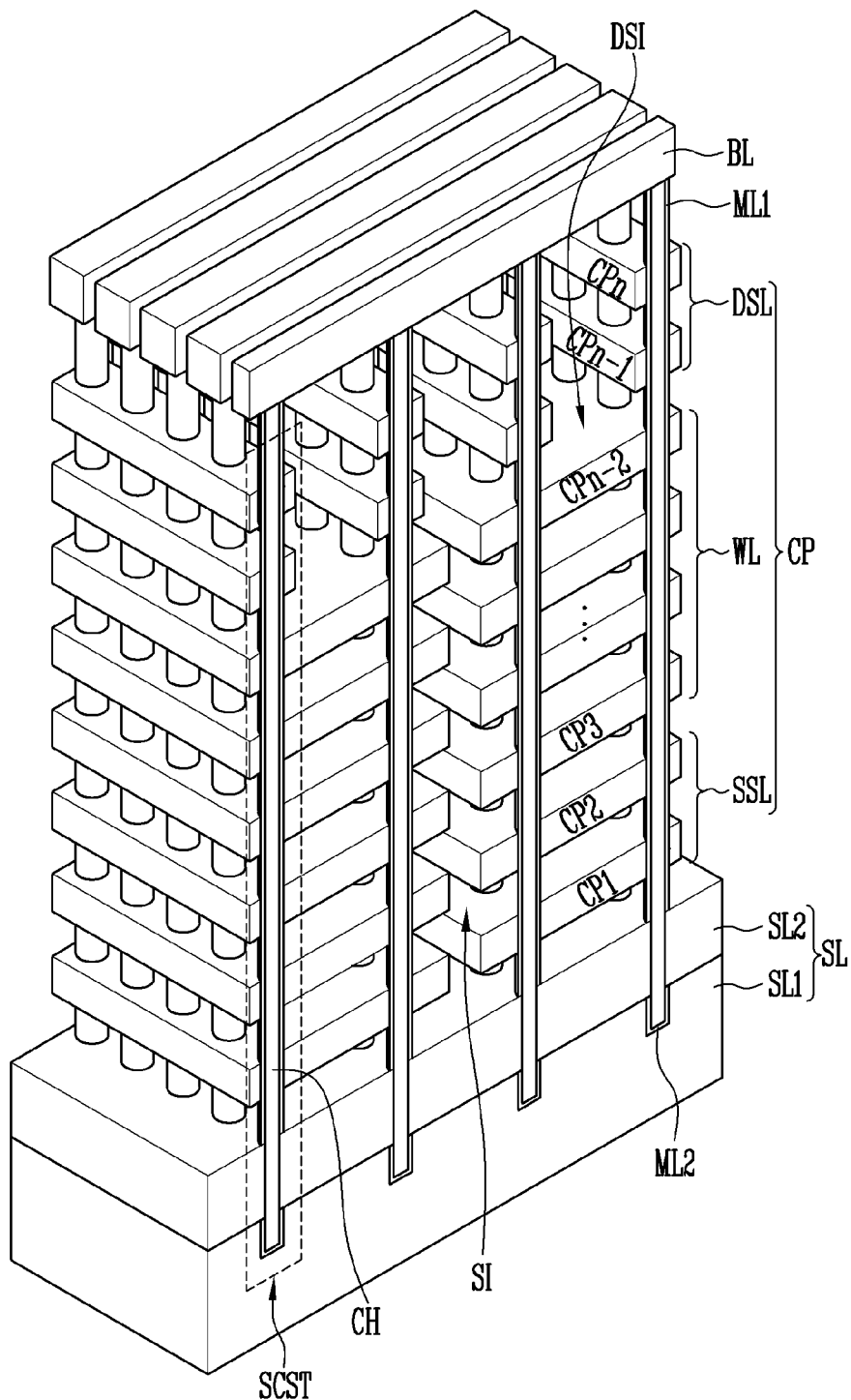

FIGS. 7B and 7C are perspective views illustrating a straight-type memory string having a three-dimensional structure.

Referring to FIGS. 7B and 7C, the straight-type memory string SCST may include memory cells and select transistors, which are stacked along a straight-type channel layer CH. Gates of the memory cells and gates of the select transistors may be connected to conductive patterns CP1 to CPn.

The channel layer CH may be formed in a tubular shape while surrounding a core insulating layer filled in a central region of a straight-type hole, or may be formed in a buried shape to be completely filled in the central region of the straight-type hole.

A top end of the channel layer CH may be electrically connected to a bit line BL. A drain contact plug (not illustrated) may be further formed between the bit line BL and the channel layer CH.

The channel layer CH may be connected to a source structure SL. The source structure SL may be formed into various structures.

As illustrated in FIG. 7B, the source structure SL may contact a bottom surface of the channel layer CH. The source structure SL may be a doped poly silicon layer. The channel layer CH contacts a top surface of the source structure SL, and may extend toward the bit line BL.

A sidewall of the channel layer CH illustrated in FIG. 7B may be surrounded by a multi-layered layer ML. The multi-layered layer ML may include a tunnel insulating layer, a data storage layer, and a blocking insulating layer. The tunnel insulating layer may be formed along the outer wall of the channel layer CH, the data storage layer may be formed along an outer wall of the tunnel insulating layer, and the blocking insulating layer may be formed along an outer wall of the data storage layer.

As illustrated in FIG. 7C, a portion of a lower end of the channel layer CH may extend to the inside of the source structure SL. In other words, the lower end of the channel layer CH may penetrate a portion of the source structure SL.

For example, the source structure SL may be formed into a structure in which a first source layer SL1 and a second source layer SL2 are stacked. The first source layer SL1 may surround the lower end of the channel layer CH. The second source layer SL2 is disposed on the first source layer SL1, and may contact a top surface of the first source layer SL1 and the sidewall of the channel layer CH. The second source layer SL2 may surround the channel layer CH.

An outer wall of the channel layer CH illustrated in FIG. 7C may be surrounded by a first multi-layered pattern ML1 and a second multi-layered pattern ML2. Each of the first multi-layered pattern ML1 and the second multi-layered pattern ML2 may include a tunnel insulating layer, a data storage layer, and a blocking insulating layer. The tunnel insulating layer may be formed along the outer wall of the channel layer CH, the data storage layer may be formed along an outer wall of the tunnel insulating layer, and the blocking insulating layer may be formed along an outer wall of the data storage layer. The second multi-layered pattern ML2 is disposed between the first source layer SL1 and the channel layer CH. The first multi-layered pattern ML1 surrounds an upper end of the channel layer CH, which protrudes upward of the second source layer SL2. The first multi-layered pattern ML1 and the second multi-layered pattern ML2 may be separated from each other with the second source layer SL2 interposed therebetween.

Referring to FIGS. 7B and 7C, the conductive patterns CP1 to CPn may be disposed in n layers spaced apart from each other between the bit line BL and the source structure SL. The conductive patterns CP1 to CPn surround the channel layer CH, and may be stacked on each other while being spaced apart from each other. The conductive patterns CP1 to CPn may include a source select line SSL, word lines WL, and a drain select line DSL. The source select line SSL may be disposed over the source structure SL. The word lines WL may be disposed over the source select line SSL. The drain select line DSL may be disposed over the word lines WL. The conductive patterns CP1 to CPn may be separated into a plurality of stack structures by a slit SI.

The source select line SSL may be disposed in one layer or two or more layers under the word lines WL. A case where the source select line SSL is configured with a first pattern CP1 disposed in the lowermost layer of the conductive patterns CP1 to CPn and a second pattern CP2 thereover is illustrated in these figures, but the present disclosure is not limited thereto.

The drain select line DSL may be disposed in one layer or two or more layers under the word lines WL. A case where the drain select line DSL is configured with an nth pattern CPn disposed in the uppermost layer of the conductive patterns CP1 to CPn and an (n−1)th pattern CPn−1 thereunder is illustrated in these figures, but the present disclosure is not limited thereto.

The conductive patterns CP1 to CPn may be separated by the slit SI. Any one of the source select line SSL and the drain select line DSL may be separated into smaller units than the word lines WL. For example, channel layers CH commonly surrounded by word lines WL may be respectively surrounded by drain select lines DSL separated from each other. In this case, the drain select line DSL may be separated by not only the slit SI but also a drain separation slit DSI, to be formed narrower than the word lines WL.

According to the structure described in FIGS. 7B and 7C, memory cells are formed at intersection portions of the channel layer CH and the word lines WL, a drain select transistor is formed at an intersection portion of the channel layer CH and the drain select line DSL, and a source select transistor is formed at an intersection portion of the channel layer CH and the source select line SSL. A source select transistor, memory cells, and a drain select transistor, which are arranged in a line along one channel layer CH, are connected in series through the channel layer CH to define a straight-type memory string SCST. The word lines WL, the source select line SSL, and the drain select line DSL correspond to the local lines LCL described in FIG. 1. For example, the word lines WL, the source select line SSL, and the drain select line DSL correspond to any one group among the local line groups LCL0 to LCLm illustrated in FIG. 2.

Figure 7D:
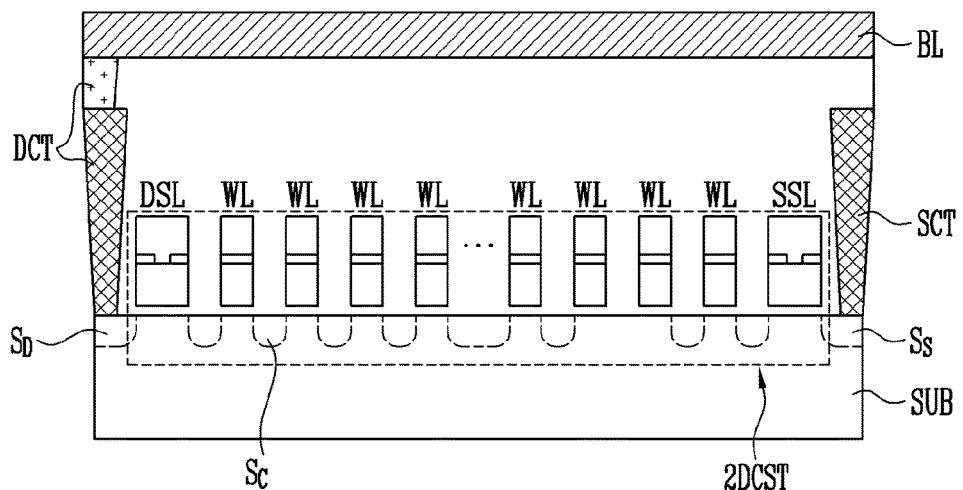

FIG. 7D is a sectional view illustrating a memory string having a two-dimensional structure.

Referring to FIG. 7D, the two-dimensional memory string 2DSCT is connected to a source select line SSL, word lines WL, and a drain select line DSL, which are formed in parallel on a substrate SUB. The word lines WL are disposed between the source select line SSL and the drain select line DSL. The two-dimensional memory string 2DCST is formed along an active region disposed in a cell region of the substrate SUB. For reference, FIG. 7D is a sectional view taken along the active region of the cell region.

Each of the source select line SSL, the word lines WL, and the drain select line DSL may be formed as a control gate layer extending along a direction intersecting the active region. A blocking insulating layer, a data storage layer, and a tunnel insulating layer may be disposed under each of the source select line SSL, the word lines WL, and the drain select line DSL. The data storage layer is disposed between the blocking insulating layer and the tunnel insulating layer, and may be formed of polysilicon. The data storage layer may be formed at only an intersection portion of the control gate layer and the active region. The data storage layer of each of the source select line SSL and the drain select line DSL may be electrically connected to the control gate layer penetrating the blocking insulating layer. The blocking insulating layer of each of the word lines WL is disposed between the control gate layer and the data storage layer, to insulate the control gate layer and the data storage layer from each other.

According to the above-described structure, memory cells are formed at intersection portions of the word lines WL and the active region, a drain select transistor is formed at an intersection portion of the drain select line DSL and the active region, and a source select transistor is formed at an intersection portion of the source select line SSL and the active region.

A dopant is implanted into the substrate SUB opened by the source select line SSL, the word lines WL, and the drain select line DSL, thereby forming junction regions $S_S$, $S_C$, and $S_D$. The junction regions $S_S$, $S_C$, and $S_D$ include cell junction regions $S_C$ formed at both sides of each of the word lines WL, a drain region $S_D$ formed at one side of the drain select line DSL, and a source region $S_S$ formed at one side of the source select line SSL. The source region $S_S$ is connected to a source contact line SCT, and the drain region $S_D$ is connected to a bit line BL via a drain contact plug DCT. The cell junction regions $S_C$ is disposed between memory cells connected to the word lines WL, connect the memory cells in series to each other.

According to the structure described above, the source select transistor, the memory cells, and the drain select transistor, which are connected in series by the junction regions $S_S$, $S_C$, and $S_D$, constitute the two-dimensional memory string 2DCST, and are arranged on the substrate SUB.

The source select line SSL, the word lines WL, and the drain select line DSL correspond to the local lines LCL described in FIG. 1. For example, the source select line SSL, the word lines WL, and the drain select line DSL correspond to any one group among the local line groups LCL0 to LCLm illustrated in FIG. 2.

Figure 8:
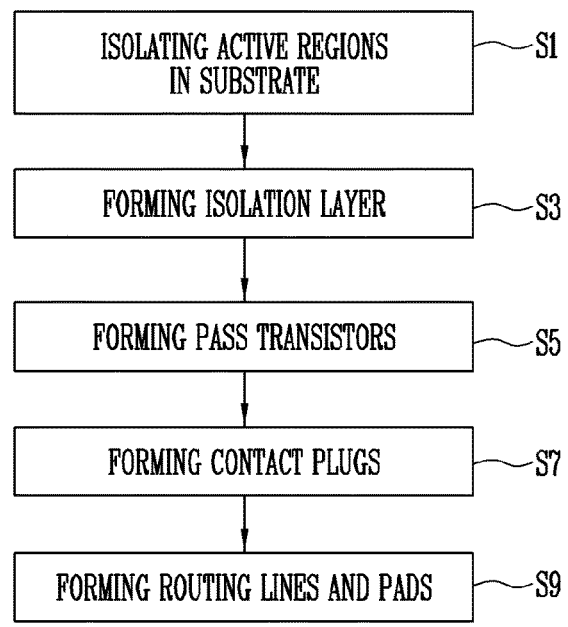
FIG. 8 is a flowchart schematically illustrating a representation of an example of a method of forming a voltage transfer unit of a semiconductor device according to an embodiment of the present disclosure.

FIG. 8 is a flowchart schematically illustrating a representation of an example of a method of forming a voltage transfer unit of a semiconductor device according to an embodiment of the present disclosure. FIGS. 9A to 9D are plan views illustrating a method illustrated in FIG. 8. FIGS. 9A to 9D illustrate, as an example, the structure of the voltage transfer unit illustrated in FIGS. 3A to 3C, but the method illustrated in FIG. 8 may be used to form the voltage transfer units according to the embodiments illustrated in FIGS. 4A to 6C.

Figure 9A:
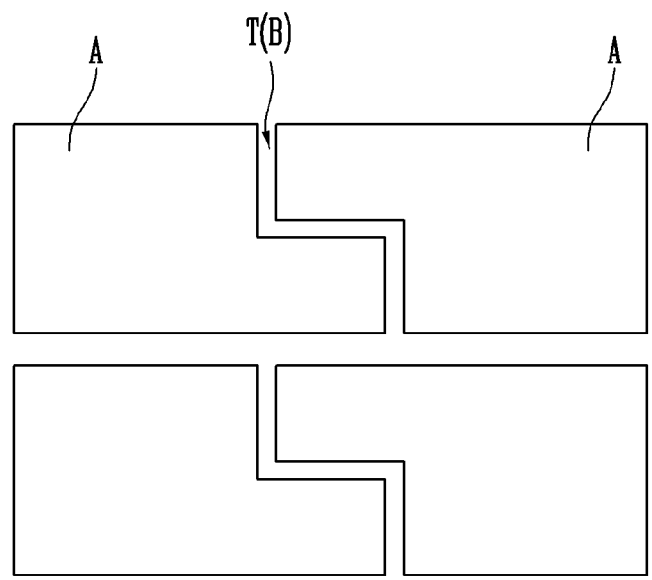
FIGS. 9A to 9D are plan views illustrating a method illustrated in FIG. 8.

Referring to FIGS. 8 and 9A, in step S1, a substrate is etched to a predetermined depth, thereby forming a trench T. Accordingly, active regions A are isolated. Subsequently, in step S3, the trench T is filled with an isolation layer B (i.e., T(B)).

Figure 9B:
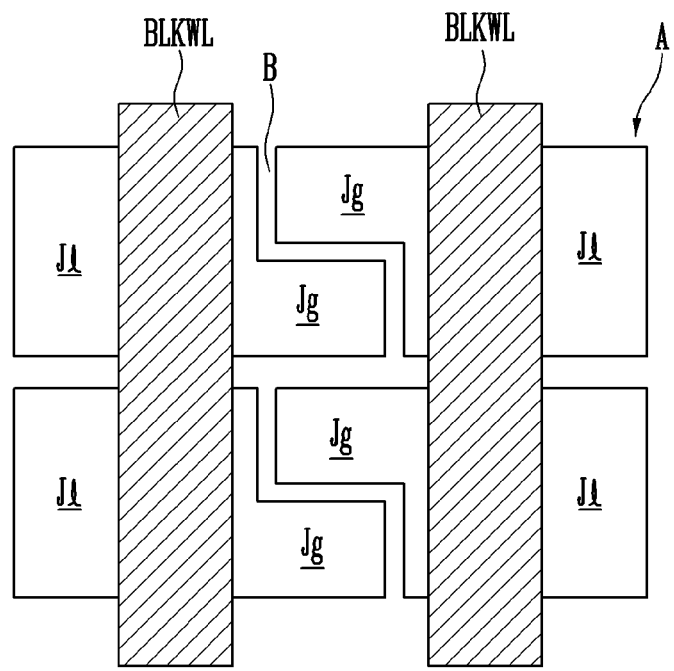

Referring to FIGS. 8 and 9B, in step S5, a pass transistor is formed on the active region A. The pass transistor includes a gate, a local junction region J1, and a global junction region Jg. The gate of the pass transistor is connected to a block word line BLKWL. To form the pass transistor, the block word line BLKWL may be formed by stacking a gate insulating layer and a gate conductive layer on the active region A and then patterning the gate insulating layer and the gate conductive layer. Subsequently, a dopant may be implanted into the active region A exposed by the block word line BLKWL, thereby forming the local junction region Jl and the global junction region Jg.

Figure 9C:
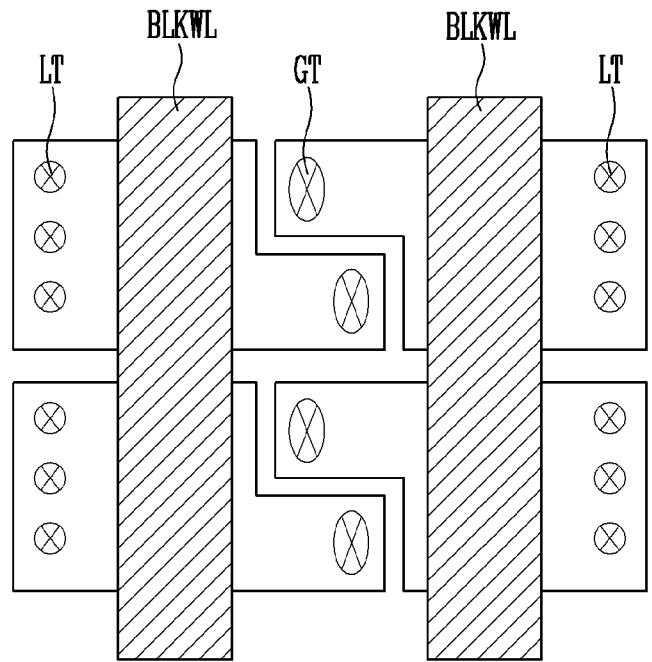

Referring to FIGS. 8 and 9C, in step S7, contact plugs LT and GT are formed. The contact plugs LT and GT include a local contact plug LT and a global contact plug GT. Step S7 may include a step of forming an insulating layer (not illustrated) covering the block word lines BLKWL, a step of forming contact holes respectively exposing the local junction region (Jl of FIG. 9B) and the global junction region (Jg of FIG. 9B) by penetrating the insulating layer, and a step of filling the contact holes with a conductive material. The local contact plug LT is connected to the local junction region (Jl of FIG. 9B), and the global contact plug GT is connected to the global junction region (Jg of FIG. 9B).

Figure 9D:
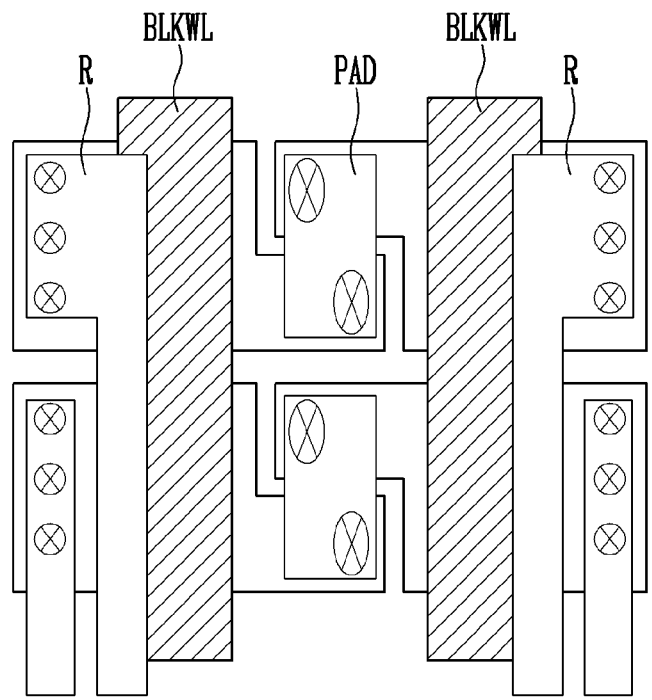

Referring to FIGS. 8 and 9D, in step S9, routing lines R and pads PAD are formed. The routing line R is connected to the local contact plug LT, and the pad PAD is connected to the global contact plug GT. The routing lines R and the pads PAD may be simultaneously formed using the same conductive material.

Figure 10:
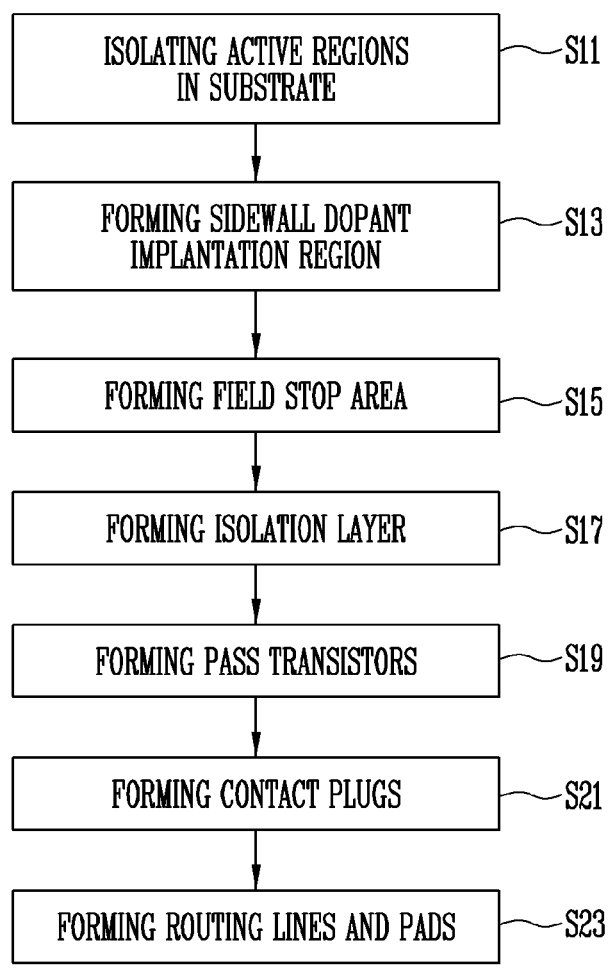
FIG. 10 is a flowchart schematically illustrating a representation of an example of a method of forming a voltage transfer unit of a semiconductor device according to an embodiment of the present disclosure.

FIG. 10 is a flowchart schematically illustrating a representation of an example of a method of forming a voltage transfer unit of a semiconductor device according to an embodiment of the present disclosure. FIGS. 11A to 11G are plan views illustrating a method illustrated in FIG. 10. FIGS. 11A to 11G illustrate, as an example, the structure of the voltage transfer unit illustrated in FIGS. 6A to 6C, but the method illustrated in FIG. 10 may be used to form the voltage transfer units according to the embodiments illustrated in FIGS. 3A to 5B.

Figure 11A:
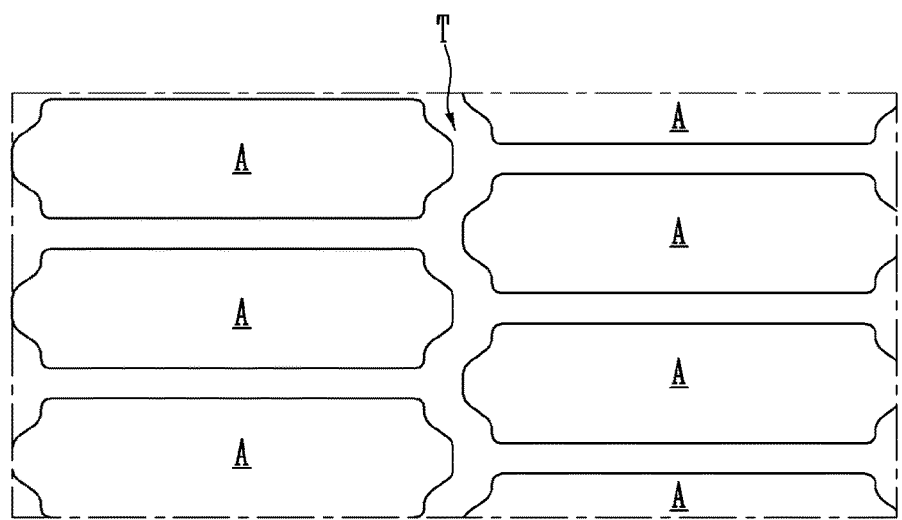
FIGS. 11A to 11G are plan views illustrating a method illustrated in FIG. 10.

Referring to FIGS. 10 and 11A, in step S11, a substrate is etched in a predetermined depth, thereby forming a trench T. Accordingly, active regions A are isolated in the substrate.

Figure 11B:
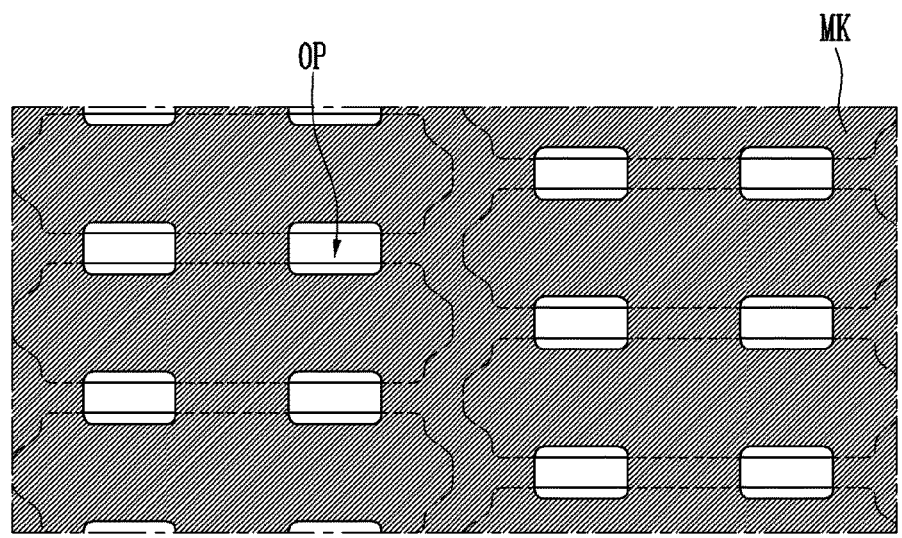
Figure 11C:
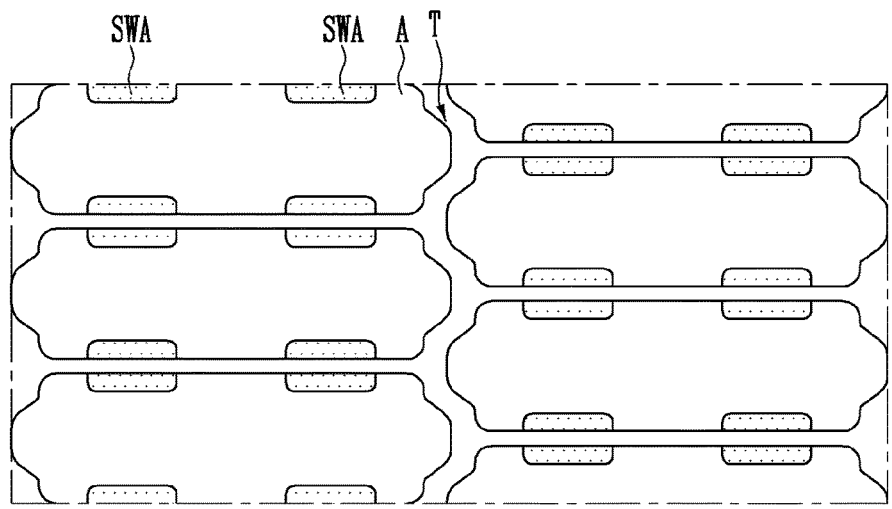

Referring to FIG. 10, in step S13, a sidewall dopant implantation region is formed. Referring to FIGS. 11B and 11C, step S13 may include a step of forming a mask pattern MK and a step of implanting a dopant into a sidewall of the active region A using the mask pattern MK as a dopant implantation barrier. The mask pattern MK may include an opening OP as illustrated in FIG. 11B. The opening OP is formed by considering a position of a block word line disposed on the active region A in a subsequent process. For example, the opening OP is disposed to expose a portion of the sidewall of the active region A overlapping with the block word line. After that, the dopant is implanted into the sidewall of the active region A exposed through the opening OP. After that, the mask pattern MK is removed. Accordingly, as illustrated in FIG. 11C, a sidewall dopant implantation region SWA may be formed at a portion of the sidewall of the active region A.

Although not illustrated in these figures, after the sidewall dopant implantation region SWA is formed, there may be further performed a step of forming a sidewall oxide layer by oxidizing a sidewall of the trench T through a radical oxidizing process, a step of forming a liner oxide layer on the sidewall oxide layer, and a step of etching the liner oxide layer through an etch-back process.

Figure 11D:
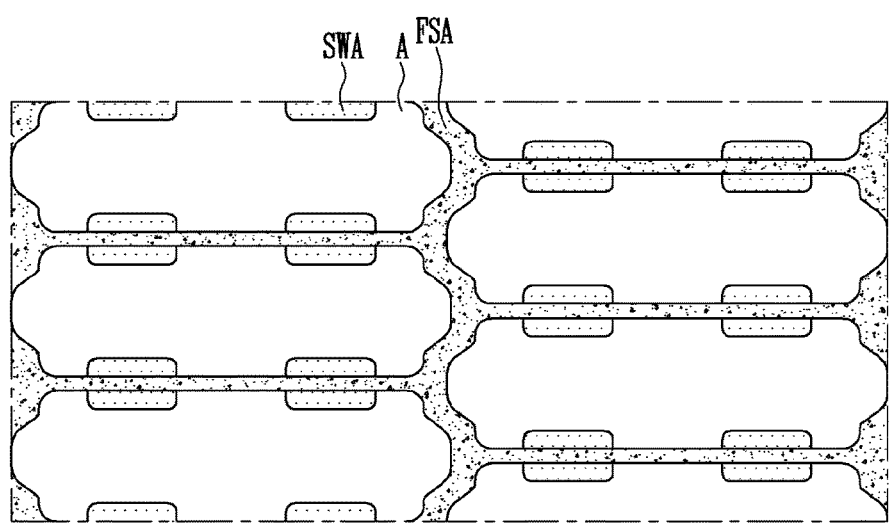

Referring to FIGS. 10 and 11D, in step S15, a field stop area FSA may be formed on a bottom surface of the trench. The field stop area FSA may be formed by implanting a dopant such as boron.

Figure 11E:
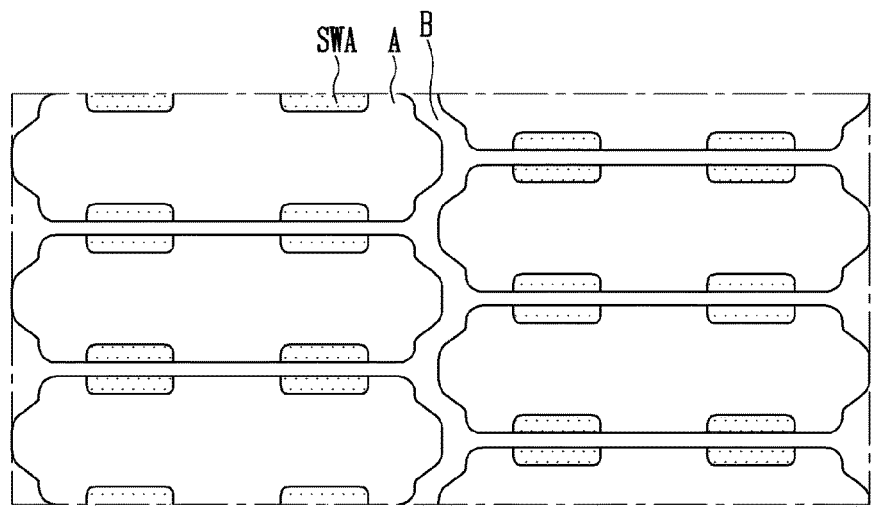

Referring to FIGS. 10 and 11E, in step S17, the trench is filled with an isolation layer B.

Figure 11F:
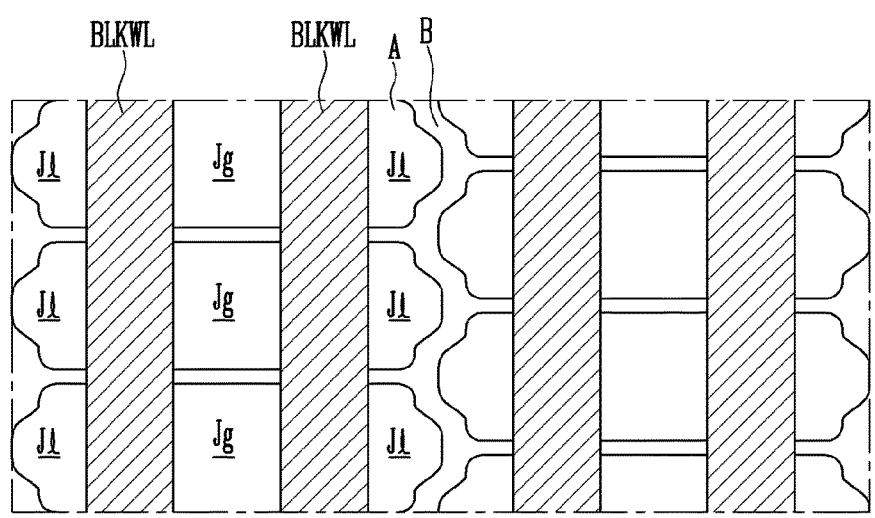

Referring to FIGS. 10 and 11F, in step S19, a pass transistor is formed on the active region A. The pass transistor includes a gate, a local junction region Jl, and a global junction region Jg. The gate is connected to a block word line BLKWL. Step S19 may include processes identical to those described in FIGS. 8 and 9B.

Figure 11G:
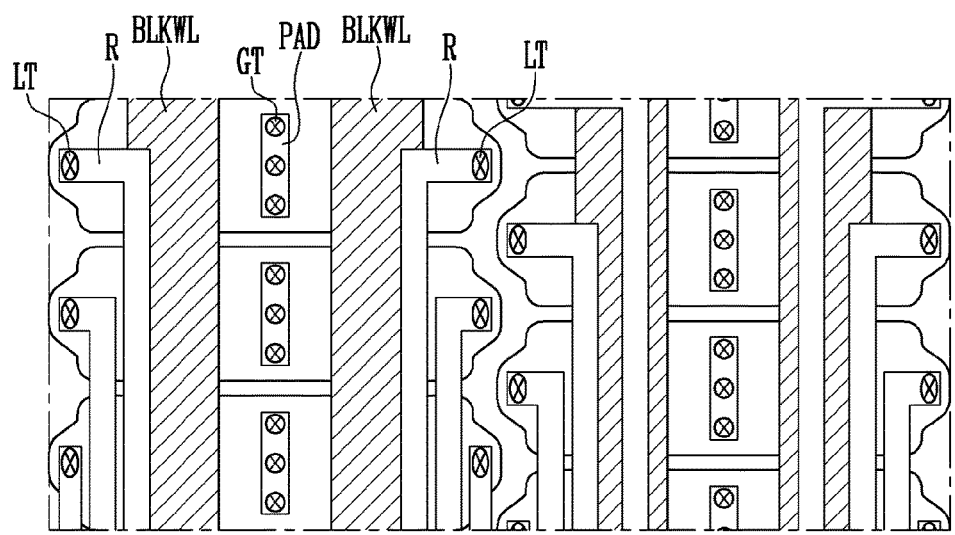

Referring to FIGS. 10 and 11G, contact plugs LT and GT are formed in step S21, and routing lines R and pads PAD are then formed in step S23.

The contact plugs LT and GT includes a local contact plug LT and a global contact plug GT. Step S21 may include processes identical to those described in FIGS. 8 and 9C.

The routing line R is connected to the local contact plug LT, and the pad PAD is connected to the global contact plug GT. Step S23 may include processes identical to those described in FIGS. 8 and 9D.

Figure 12:
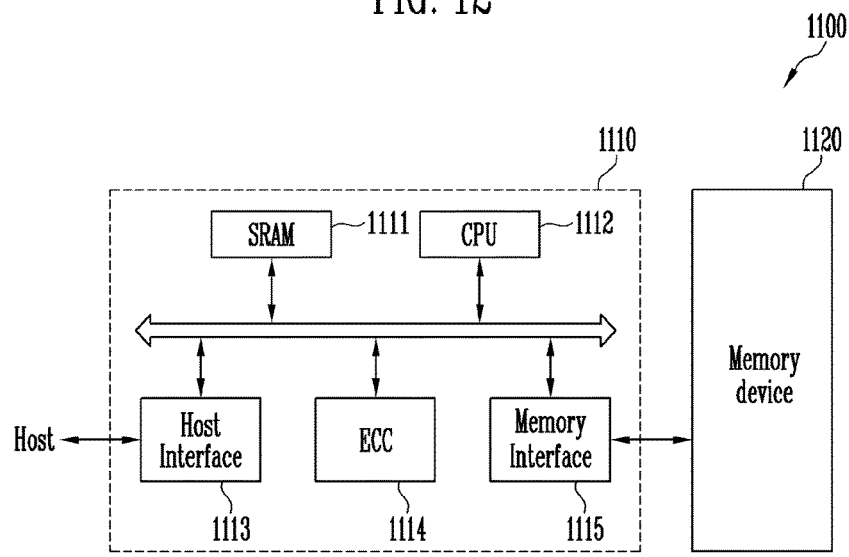
FIG. 12 is a block diagram illustrating a representation of an example of a memory system according to an embodiment of the present disclosure.

FIG. 12 is a block diagram illustrating a representation of an example of a memory system according to an embodiment of the present disclosure.

Referring to FIG. 12, the memory system 1100 according to an embodiment of the present disclosure includes a memory device 1120 and a memory controller 1110.

The memory device 1120 may include a semiconductor device described in FIGS. 1 and 2. The memory device 1120 may include a memory block, the memory block including at least one of the voltage transfer units described in FIGS. 3A to 6C and at least one of the memory strings described in FIGS. 7A to 7D.

The memory device 1120 may be a multi-chip package formed of a plurality of flash memory chips.

The memory controller 1110 may be configured to control the memory device 1120, and may include a static random access memory (SRAM) 1111, a central processing unit (CPU) 1112, a host interface 1113, an error correction code (ECC) block 1114, and a memory interface 1115. The SRAM 1111 may be used as an operation memory of the CPU 1112. The CPU 1112 may be perform general control operations so that the memory controller 1110 may exchange data. The host interface 1113 may include a data exchange protocol for a host connected with the memory system 1100. Also, the ECC block 1114 may detect and correct errors included in a data read from the memory device 1120 and the memory interface 1115 may interface with the memory device 1120. In addition, the memory controller 1110 may further include a read only memory (ROM) for storing code data for interfacing with the host, and the like.

The memory system 1100 configured as described above may be a memory card or a solid state disk (SSD), in which the memory device 1120 is combined with the controller 1110. For example, when the memory system 1100 is an SSD, the memory controller 1100 may communicate with the outside (e.g., the host) through one among various interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, and an integrated drive electronics (IDE) protocol.

Figure 13:
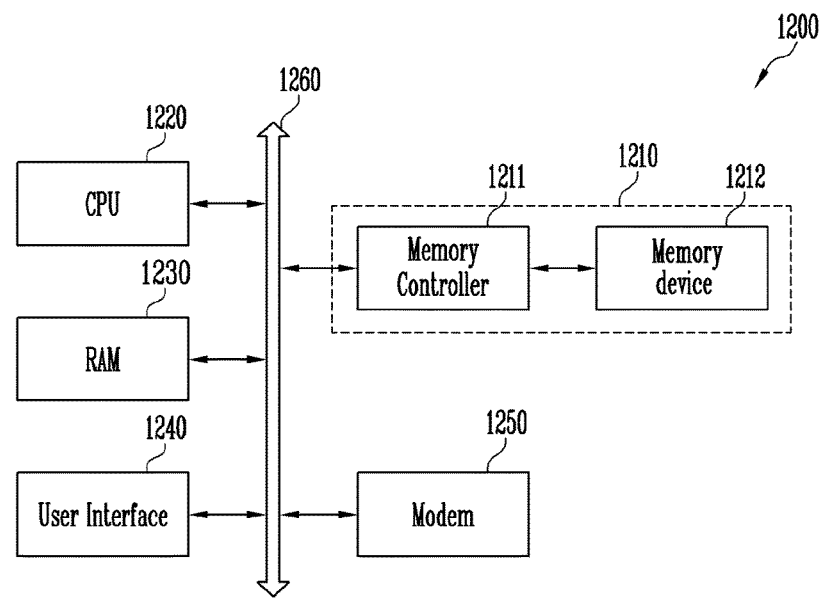
FIG. 13 is a block diagram illustrating a representation of an example of a computing system according to an embodiment of the present disclosure.

FIG. 13 is a block diagram illustrating a representation of an example of a computing system according to an embodiment of the present disclosure.

Referring to FIG. 13, the computing system 1200 according to an embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, the computing system 1200 may further include a battery for supplying an operation voltage to the computing system 1200, and further include an application chip set, a camera image processor (CIS), a mobile D-RAM, and the like.

The memory system 1210, as described with reference to FIG. 12, may be configured with a memory device 1212 and a memory controller 1211.

The semiconductor device according to the present disclosure includes first and second transistors for transferring high voltages, and forms, into various structures, active regions in which the first and second transistors are disposed, so that characteristics of high voltage transistors can be secured within a narrow area.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
    a first active region including a first main region and a first protruding part, the first protruding part protruding along a first direction from a portion of the first main region;
    a second active region including a second main region and a second protruding part, the second main region opposite to the first main region with the first protruding part interposed between the first main region and the second main region, the second protruding part protruding from the second main region and interposed between the first main region and the second main region;
    a first transistor formed on the first active region;
    a second transistor formed on the second active region; and
    a connecting structure connecting the first protruding part and the second protruding part to each other,
    wherein a gate of the first transistor is connected to a first block word line disposed on the first active region,
    a gate of the second transistor is connected to a second block word line disposed on the second active region, and
    the connecting structure is disposed between the first block word line and the second block word line.

2. The semiconductor device of claim 1, wherein the connecting structure includes:
    a first global contact plug contacting a top surface of the first protruding part;
    a second global contact plug contacting a top surface of the second protruding part; and
    a global pad contacting a top surface of the first global contact plug and a top surface of the second global contact plug.

3. The semiconductor device of claim 2, wherein the global pad is connected to a global line to which an operation voltage output from a voltage generation circuit is transmitted.

4. The semiconductor device of claim 2, further comprising:
    an isolation layer configured to structurally isolate the first active region and the second active region,
    wherein the isolation layer is disposed in a substrate between the first active region and the second global contact plug and between the second active region and the first global contact plug.

5. The semiconductor device of claim 1, wherein the connecting structure includes:
    a first global contact plug contacting a top surface of the first protruding part, the first global contact plug being disposed closer to the second block word line than the first block word line;

a second global contact plug contacting a top surface of the second protruding part, the second global contact plug being disposed closer to the first block word line than the second block word line; and a global pad contacting a top surface of the first global contact plug and a top surface of the second global contact plug.

6. The semiconductor device of claim 1, further comprising:

global junction regions of the first and second transistors connected to each other through the connecting structure, the global junctions respectively formed inside the first active region and the second active region between the first block word line and the second block word line;

local junction regions of the first and second transistors formed inside the first main region and the second main region, the local junction regions opposite to each other with the first block word line and the second block word line interposed between the local junction regions opposite to each other; and local lines extending from different memory blocks and respectively connected to the local junction regions of the first and second transistors.

7. The semiconductor device of claim 1, wherein the first block word line transmits different block signals than the second block word line.

8. The semiconductor device of claim 1, further comprising an isolation layer isolating the first active region and the second active region from each other.

\* \* \* \* \*